United States Patent [19]
Kablanian

[11] Patent Number: 6,091,620
[45] Date of Patent: Jul. 18, 2000

[54] MULTI-BANK MEMORY WITH WORD-LINE BANKING, BIT-LINE BANKING AND I/O MULTIPLEXING UTILIZING TILABLE INTERCONNECTS

[75] Inventor: Adam Kablanian, San Jose, Calif.

[73] Assignee: Virage Logic Corporation, Fremont, Calif.

[21] Appl. No.: 09/347,955

[22] Filed: Jul. 6, 1999

[51] Int. Cl.[7] .................................................. G11C 5/06
[52] U.S. Cl. ................................ 365/63; 365/72; 365/51;
365/230.03; 365/230.04; 365/230.05; 365/230.06;
365/189.02
[58] Field of Search .................................. 365/63, 72, 51,
365/230.03, 230.04, 230.05, 230.06, 189.02

[56] References Cited

U.S. PATENT DOCUMENTS 5,500,822  3/1996  Han ........................................... 365/200
5,506,816  4/1996  Hirose et al. ....................... 365/230.06

*Primary Examiner*—Andrew Q. Tran
*Attorney, Agent, or Firm*—Fenwick & West LLP

[57] ABSTRACT

A multiple bank memory array includes a combined memory array, an X-decoder, a first word-line driver, a second word-line driver, a reference column, a Y-multiplexer and pre-charging circuit, a sense amplifier and input/output circuit, and control and pre-coding logic. Signals are received and applied to the combined memory array and the other components via the control and pre-decode logic and the input/output circuit. The control and pre-decode logic receives control signals to control and address the combined memory array, and uses a single bit for two dimensional decoding. This architecture for multiple bank memory cell arrays a novel technique for word-line banking using tilable strap cells in a first embodiment that provides a combined array, does not require routing and eliminates redundant reference columns. The multiple bank memory array in a second embodiment also includes a novel technique for bit-line banking that eliminates sense amplifiers, provides for tilable connection between the sense amplifiers and the input/output circuit, and maintains an optimum aspect ratio. In a third embodiment, the invention provides a tilable I/O interconnect structure for use on another level of banking. The banking concepts provided in the present invention are independent of the type of memory cell and applicable to all varieties of memory cells.

27 Claims, 20 Drawing Sheets

MULTI-BANK MEMORY WITH WORD-LINE BANKING, BIT-LINE BANKING AND I/O MULTIPLEXING UTILIZING TILABLE INTERCONNECTS

CROSS-REFERENCES TO RELATED APPLICATIONS

This application relates to U.S. patent application Ser. No. 09/347,372 filed Jul. 06, 1999, by Adam Kablanian and entitled "Multi-Bank Memory With Word-Line Banking" which is incorporated herein by reference.

BACKGROUND OF THE INVENTION

1. Field of the Invention

This invention relates generally to the field of memory logic devices and more specifically to memory devices having multiple banks of memory arrays. More particularly, the present invention relates to memory arrays that allow for word-line banking and bit-line banking. Still more particularly, the present invention relates to memory array that uses a combination of word-line banking, bit-line banking and I/O multiplexing utilizing tilable components.

2. Description of the Background Art

Memory devices are well known in the semiconductor industry. Memory cores for integrated circuits continue to be improved. Because of the proliferation and popularity of Application Specific Integrated Circuits (ASIC), there is a need for improved designs for memory arrays. New memory arrays are needed because of the every decreasing size and power requirements. For example, new uses for ASICs such as cellular telephones, portable computers, and hand held devices require new memory arrays that require less circuit area to implement, and consume less power to extend battery life.

There are a number of approaches in the prior art for making ultra low power and high speed memory devices using multiple banks of memory arrays. A typical prior art multiple bank memory is shown in FIG. 1. As can be seen, the prior art multiple bank memory includes an X-decoder 108, control and pre-decoding logic 120, and pairs of reference columns 102, 114, memory cell arrays 104, 112, word-line drivers 106, 110, pre-charge circuits and Y-decoders or multiplexers 116, 122, and sense amplifiers and input/output (I/O) circuits 118, 124. While the prior art provides some power reduction and speed improvement, there are no multiple bank prior art designs that utilize any type of tilable interconnecting structure between the multiple banks or portions of the arrays themselves. Instead, the prior art creates such multiple bank designs with either custom layouts or utilizing place and route tools to add the connectivity needed between the multiple banks of memory cells. Thus, the prior art requires a brute force approach to making multiple bank memories where there is significant design effort required each time the memory is added with other components in an ASIC.

In particular, when used in a memory compiler implementation, the conventional banking approach has a number of shortcomings. First, routing of signals in the memory is difficult and consumes circuit area, in addition to requiring place and route capability for the manufacturing process. As depicted by the lines between the sense amplifiers 118 and 124, routing adds multiplexing, delay and area as compared with single bank architectures. Second, there is an area penalty because the multiplexer lines need to be switched between arrays. Third, the additional capacitance of the multiplexer lines degrades the performance of the device. Finally, the conventional architecture shown in FIG. 1 provides non-optimum aspect ratios, especially when the word size increases in width. This often results in an additional area penalty and a tighter pitch with which to work.

Therefore, there is a need for systems and method for constructing multiple bank memory cell arrays that are tilable, smaller in size, consume less power, and reduce electrical interference.

SUMMARY OF THE INVENTION

The present invention overcomes the deficiencies and limitations of the prior art with a unique architecture for multiple bank memory cell arrays. The architecture for multiple bank memory cell arrays is advantageous because of a number of features. First, the multiple bank memory cell of the present invention includes a novel technique for word-line banking that provides a combined array utilizing a tilable connection that does not require routing, and eliminates redundant reference columns. The word-line banking of the present invention may also be used independent of the type of memory cells forming the combined array. Second, the present invention also includes a novel technique for bit-line banking that eliminates sense amplifiers, provides for tilable connection between the sense amplifiers and the input/output circuit, and maintains an optimum aspect ratio. Finally, the present invention also includes a tilable method for providing coupling and multiplexing between input/output circuits.

A preferred embodiment of a multiple bank memory array according to the present invention includes a combined memory array, an X-decoder, a first word-line driver, a second word-line driver, a reference column, a Y-multiplexer and pre-charging circuit, a sense amplifier and input/output circuit, and control and pre-coding logic. Signals are received and applied to the combined memory array and the other components via the control and pre-decode logic and the input/output circuit. The control and pre-decode logic receives control signals to control and address the combined memory array. Data is input and output to the combined memory array via the input/output circuit. The combined array is particularly advantageous because it reduces the power consumed by activating only half the word line at a given time. In other words, half the word line is switching and half the bit lines are pre-charging and discharging. The combined array is also advantageous in that routing is not required for the multiple banks because the arrays are merged into a single array that is partitioned using the most significant bit of the X address value.

These and other features and advantages of the present invention may be better understood by considering the following detailed description of a preferred embodiment of the invention. In the course of this description, reference will frequently be made to the attached drawings.

DETAILED DESCRIPTION OF THE PREFERRED EMBODIMENTS

Figure 2:
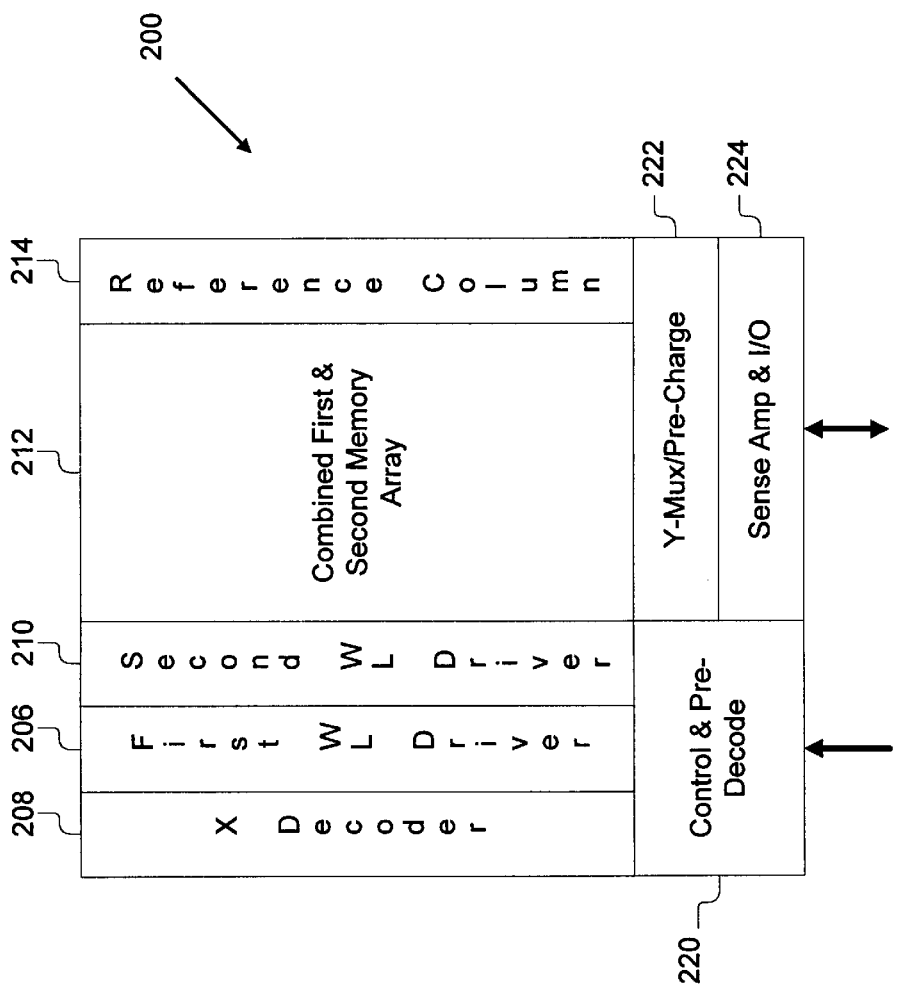
FIG. 2 is a block diagram of a first embodiment of multi-bank memory unit using word-line banking utilizing a tilable connection according to the present invention.

Referring now to FIG. 2, a block diagram of a first and preferred embodiment of the multi-bank memory unit 200 using word-line banking according to the present invention is shown. The first embodiment of the multi-bank memory unit 200 preferably comprises a combined memory array 212, an X-decoder 208, a first word-line driver 206, a second word-line driver 210, a reference column 214, a Y-multiplexer and pre-charging circuit 222, a sense amplifier and input/output circuit 224, and control and pre-coding logic 220. The present invention includes a number components including those just identified. Each of these components is conventional in certain respects, however, many of the components are different in ways (that will be identified below as each is discussed) that allow the present invention to provide an architecture for multi-bank memories that requires less area to implement, requires less power to operate and can be used repeatedly in a tiled design. For example, the multi-bank memory unit 200 utilizes only a single reference column 214 which reduces the area of the memory unit 200 as well as reducing the power requirements. Moreover, the present invention is not discussed with regard to a particular, word or array size since the number of bits input and output could be any number adapted to the needs of the user.

The control and pre-decoding logic 220 receives signals for processing data including control and addressing signals. The control and pre-decoding logic 220 in turn transmits these signals to the other components of the multi-bank memory unit 200 to control storage in and retrieval of data from the memory unit 200, as will be described in more detail below. The control and pre-decoding logic 220 is formed from conventional digital logic devices formed as part of an integrated circuit, and is similar to conventional types of control logic. The control and pre-decoding logic 220 is notably different in at least one respect, namely that at least one bit, preferably the most significant bit of the X-address decoder, is used to control the operation of the word-line drivers 206, 210 and Y-multiplexer and pre-charging circuit 222.

The X-decoder 208 is coupled to the control and pre-decoding logic 220 to receive addressing signals from the control and pre-decoding logic 220. The X-decoder 208 receives the address signals, identifies which words of the array 212 are to be asserted and generates a signal for each word to be asserted and outputs the signal. The X-decoder 208 has a conventional design as will be understood to those skilled in the art. The outputs of the X-decoder 208 are coupled to the first word-line driver 206 and the second word-line driver 210. The first word-line driver 206 and the second word-line driver 210 are advantageously positioned adjacent and closed to the X-decoder 208 to minimize the length of signal lines connection the devices 206, 208, 210. The first word-line driver 206 and the second word-line driver 210 are preferably groups of buffer drivers that receive signals from the X-decoder 208 and assert and amplify the signals over a portion of the array 211 so that particular words are accessed. The first word-line driver 206 preferably drives the output of the X-decoder 208 over a first half of the array 212 referred to the left array, and the second word-line driver 210 drives the output of the X-decoder 208 over a second half of the array 212 referred to the right array. Thus, signals provided in the horizontal direction provide the input from the X-decoder 208 to the combined memory array 212.

The present invention advantageously provides the multiple bank array as a combined memory array 212. The combined memory array 212 preferably includes a plurality of memory cells grouped for access on a word basis. The combined memory array 212 preferably accesses a first half of the cells as a first or left plane and the other half of the cells as the second or right plane. The individual memory cells have a conventional design, however, are enabled on a word basis. The individual memory cells are described in more detail below with reference to FIGS. 10A–10C, and the word size may be any size from 2 to n. Even though they are referred to and shown as distinct portions of the array, those skilled in the art will realize that the array 212 may organize the particular cells in any number of ways including but not limited to rows of alternating cells of the left array and the right array; rows of two cells of the left array then two cells of the right array repeated across the array; and rows of the cells of left array and then cell of the right array. The aspect ratio of the array 212 may be controlled by grouping cells in a row by groups of 4, 8, 16, 32 or other powers of 2 and then alternating between the left plane the right plane as describe above for groups of 2. The present invention advantageously operates the combined memory array 212 with about half the power compared with the prior art by switching half the word lines at any given time and also charging or discharging only half the bit lines. The organization as a combined array 212 is also advantageous because it provides the optimum aspect ratio for the memory unit 200, especially for wide bit configurations.

The reference column 214 is provided to a self-timed reset signal the array 212 and other components. The reference column 214 is preferably located adjacent to the combined memory array 212 on the side opposite the word-line drivers 206, 210. In contrast to the prior art, the present invention requires only a single reference column 214 for operation. This is significant because the area penalty in having to provide a second reference column can be as much as eight times the area of the reference column due to the additional area required lines for input/output connections. Because of the unique architecture of the present invention and the usage of a combined array 212, only a single reference column is needed. Thus, the area and power consumed by a second reference column are eliminated with the present invention.

Below the combined memory array 212, the present invention positions the Y-multiplexer and pre-charging circuit 222, and the sense amplifiers and input/output circuit 224. Thus, it can be seen with the architecture of the present invention, no routing is required to achieve word-line banking because the tilable interconnect is formed as part of the memory cell as will be described in more detail with reference to FIG. 4B. The Y-multiplexer and pre-charging circuit 222 are conventional types, with the pre-charging circuit 222 charging the lines of the array 212 for reading and writing, and the Y-multiplexer providing one of two or more inputs to the sense amplifiers and input/output circuit 224. The Y-multiplexer and pre-charging circuit 222 are coupled to the cells of the array by lines extending generally vertically over the length of the array 212. The present invention advantageously reduces the number of sense amplifiers 224 by at least half by providing the Y-multiplexers, reading only half the array at a given time, and providing a single sense amplifier for multiple bit lines. The sense amplifiers and input/output circuit 224 are positioned below the Y-multiplexer and pre-charging circuit 222. The sense amplifiers generate data to be output from the array 212. This data is passed to the input/output circuit for transmission out of the memory unit 200. The input/output circuit is also the source of data for storage in the array 212 from outside the memory unit 200.

Figure 3A:
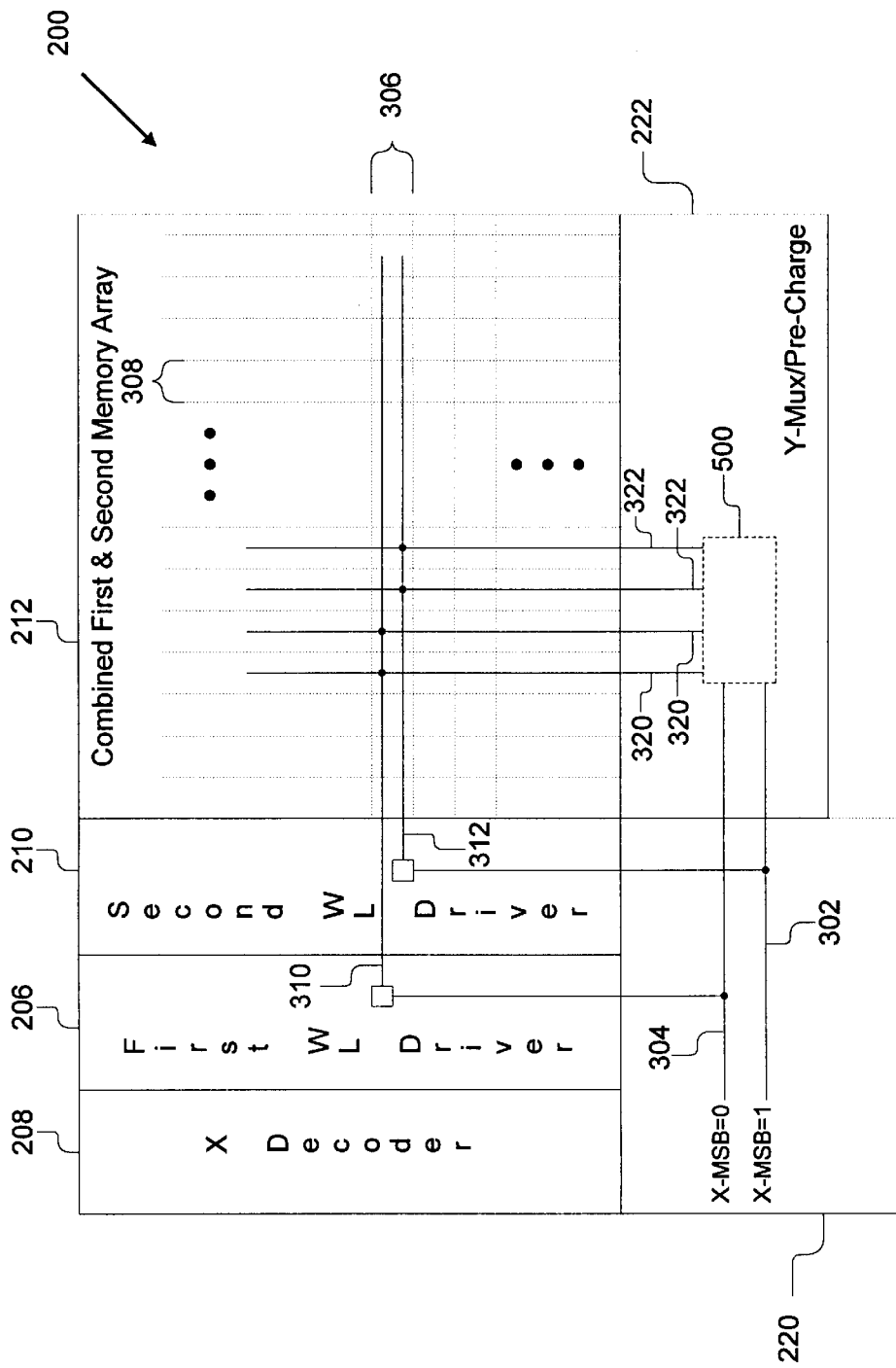
FIG. 3A is a partial block diagram of the first embodiment of the multi-bank memory unit according to the present invention showing single port cells and word lines.

Referring now to FIG. 3A, a primary feature of the present invention is highlighted. FIG. 3A shows a partial block diagram of the first embodiment of the multi-bank memory unit 200 including some cells, word lines and a particular portion of the control logic 220. The multi-bank memory unit 200 advantageously uses one bit (preferably the most significant bit) of the X address to: 1) select which word lines 310, 312 between the word lines 310 for first plane and the word lines 312 for the second plane will be active; and 2) select which corresponding ones from pairs of Y-multiplexer and pre-charging circuits will be operational. As noted above, the control and pre-decoding logic 220 receives information for addressing the cells of the combined memory array 212. In addition to passing this information to the X-decoder 208 for accessing the array 212 in one dimension, the control and pre-decoding logic 220 also includes logic for generating a first selection signal on line 304 and a second selection signal on line 302. The first and second selection signals are preferably asserted based on the value of the most significant bit (MSB) of the X dimension address. Those skilled in the art will recognize that a variety of other control input signals may be used as the basis to generate the first and selection signals such as other bits of the X address, as well as that the selection logic may be constructed from combinational logic. In the preferred embodiment by way of example, if the MSB of the X address has a value of 0, then the first selection signal on line 304 is asserted. On the other hand, if the MSB of the X address has a value of 1, then the second selection signal on line 302 is asserted.

Continuing to refer to FIG. 3A, the first selection signal is provided to the first word-line driver 206 via line 304. The first word-line driver 206 uses the signal to enable the application of signals on word lines 310 as represented by the box in FIG. 3. In other words, the first selection signal controls whether the first word-line driver 206 is able to send word line signals on line 310 to the array 212. Although only shown for a single row of cells 306, those skilled in the art will understand how the signal on line 304 is used for all rows in the first plane of the combined memory array 212. Similarly, the control and pre-decoding logic 220 is coupled by line 302 to the second word-line driver 210 to provide the second selection signal. The second selection signal on line 302 is used by the second word-line driver 210 to control whether the second word-line driver 210 is able to provide word line signals on line 312 to the rows 306 of cells in the second plane of the combined memory array. This feature is best shown by the dots in respective cells of the array 212, where the dots represent connections to and providing of the driver signals to respective cells of the array 212. Each column 308 of cells of the array 212 are coupled by bit lines 320, 322 that extend to the Y-multiplexer and pre-charging circuit 222. Preferably, there are a plurality of bit lines for each column 308 of cells and these bit lines are represented by lines 320, 322. For example, for an array of single port memory cells, lines 320, 322 each represent two bit lines, whereas for an array of dual port memory cells, lines 320, 322 each represent four bit lines as will become apparent from the discussion below of FIG. 10A–10B. As shown, the signal lines 302 and 304 are also coupled to the Y-multiplexer and pre-charging circuit 222, and are used to control their operation as will be discussed below with reference to FIG. 5. As shown in FIG. 3A, a plurality of portions 500 of the Y-multiplexer and pre-charging circuit 222 are provided (although only one is shown) within which bit lines 320, 322 from the left and right array, and the first and second selection signal lines 302, 304 converge to provide data and control for operation of the Y-multiplexer and pre-charging circuit 222 such that a single sense amplifier may be used for a number of columns of the combined memory array 212.

This use of a single bit to control both X-decoding via the word-line drivers 206, 210 and the Y-multiplexer and pre-charging circuit 222 provides a significant area reduction since the number of I/O buffers and sense amplifiers can be reduced by nearly half. Since planes of the array are alternatively used using the MSB for control this provides a significant area savings in addition to the power savings.

Figure 3B:
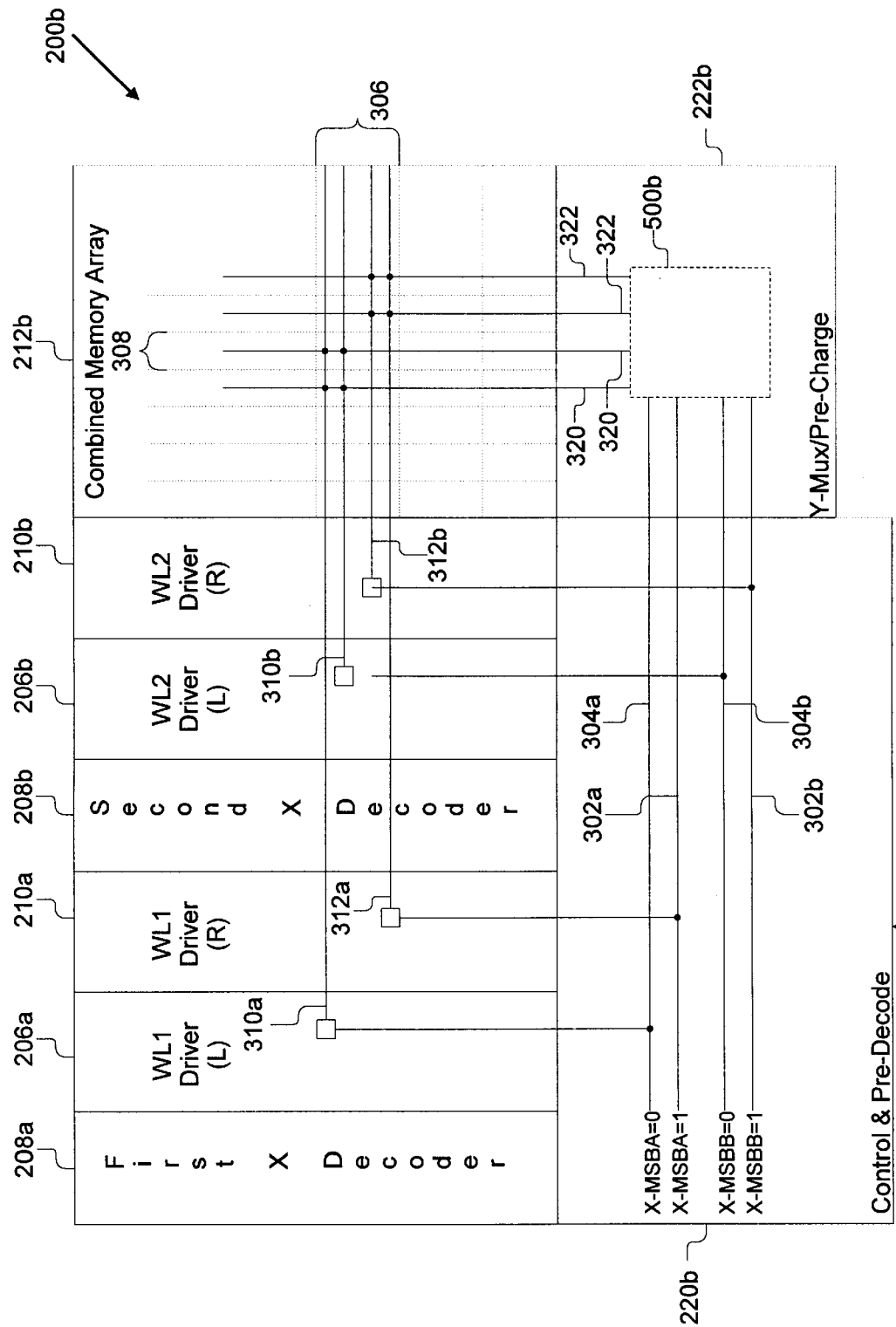
FIG. 3B is a partial block diagram of the first embodiment of the multi-bank memory unit according to the present invention for dual port memory cells and word lines.

Referring now to FIG. 3B, another embodiment of the multi-bank memory unit 200b according to the present invention is shown. The memory unit 200b is an adaptation of the present invention for use with dual port memory cells. For ease of understanding, like reference numerals have been used for parts having functionality similar to that described above with reference to FIG. 3A. As shown in FIG. 3B, the dual port cells are represented by each cell having a pair of dots in contrast to FIG. 3A where only there is only a single dot for each cell. Since the cells are dual port, each cell is capable of receiving two addresses for reading and writing. The multi-bank memory unit 200b preferably comprises a combined memory array 212b, an first X-decoder 208a, a second X-decoder 208b, a first, second, third and fourth word-line drivers 206a, 206b, 210a, 210b, the Y-multiplexer and pre-charging circuit 222b, and control and pre-coding logic 220b. Although not shown in FIG. 3B, the multi-bank memory unit 200b includes a reference column 214 and a sense amplifier and input/output circuit 224.

The combined memory array 212b is similar to that of FIG. 3A, except that it is a dual port memory instead of a single port memory. The combined memory array 212b has a left and a right plane, and differs by providing two word lines for each cell and four bit lines for each cell, as will be discussed with reference to FIG. 10B below.

Since the combined memory array 212b is capable of receiving two words, the second X-decoder 208b, and additional word-line drivers 206b, 210b are added to provide such signals. The first X-decoder 208a and the WL1 word-line drivers 206a, 210a are provided to generate the first word address. In particular, the first X-decoder 208a decodes the first word address and is coupled to the control logic and pre-decode logic 220 to receive the first word address. The first X-decoder 208a works as described above to assert the appropriate rows of the combined array 212b using the WL1 word-line drivers 206a, 210a by generating the first word line signals on lines 310a, 312a. Based on the row specified by the first X-decoder 208a, the WL1 (L) word-line driver 206a will provide word line signals using signal line 310a to the left portion of the array 212b and the WL1 (R) word-line driver 210a will provide word line signals using signal line 312a to the right portion of the array 212b for the first word address. The second X-decoder 208a operates in a similar manner but decodes the second word address. The second X-decoder 208a is correspondingly coupled to the WL2 (L) word-line driver 206b and the WL2 (R) word-line driver 210b to respectively provide the second word line signals to the left and right portions of combined array 212b for the second word address. The WL2 (L) word-line driver 206b and the WL2 (R) word-line driver 210b provide the word line signals using signal lines 310b and 312b, respectively, to the left and right portions of the array 212b.

The Y-multiplexer and pre-charging circuit 222b and control and pre-coding logic 220b provide basically the same functionality as has been described above with reference to FIG. 3A. One notable difference is shown for the control and pre-coding logic 220b. As can be seen, the second embodiment of the multi-bank memory unit 200b also advantageously uses one bit (preferably the most significant bit) of each X address to: 1) select which word lines 310a, 310b, 312a, 312b between the word lines 310a, 310b for first plane and the word lines 312a, 312b for the second plane that will be active; and 2) select which corresponding ones from pairs of Y-multiplexer and pre-charging circuits will be operational. The control and pre-coding logic 220b is also modified to pass the addresses information for the two words to the first and second X decoder 208, 208b respectively, as will be understood to those skilled in the art. More specifically, since two address words are provided to the array 212b, the control and pre-coding logic 220b is modified as compared to that of FIG. 3A. The control and pre-coding logic 220b uses a bit, preferably the most significant bit, of each X word address to control respective word-line drivers 206a, 206b, 210a, 210b and respective portions of the Y-multiplexer and pre-charging circuit 222b. As shown, bit values from the first address word are provided on lines 302a, 304a to the WL1 (L) driver 206a and the WL1 (R) driver 210a to alternatively enable the left and right array portions for the first word, and similarly, bit values from the second address word are provided on lines 302b, 304b to the WL2 (L) driver 206b and the WL2 (R) driver 210b to alternatively enable the left and right array portions for the second word. The control and pre-coding logic 220b is also modified to accept two words and provide the words to the appropriate X decoder 208a, 208b. The control and pre-coding logic 220b provides these same bits of the first and second words to the portion 500b of the Y-multiplexer and pre-charging circuit 222b, there are four signal lines provided to the portion 500b as compared with only two signal lines for single port array 212 embodiment.

Figure 4A:
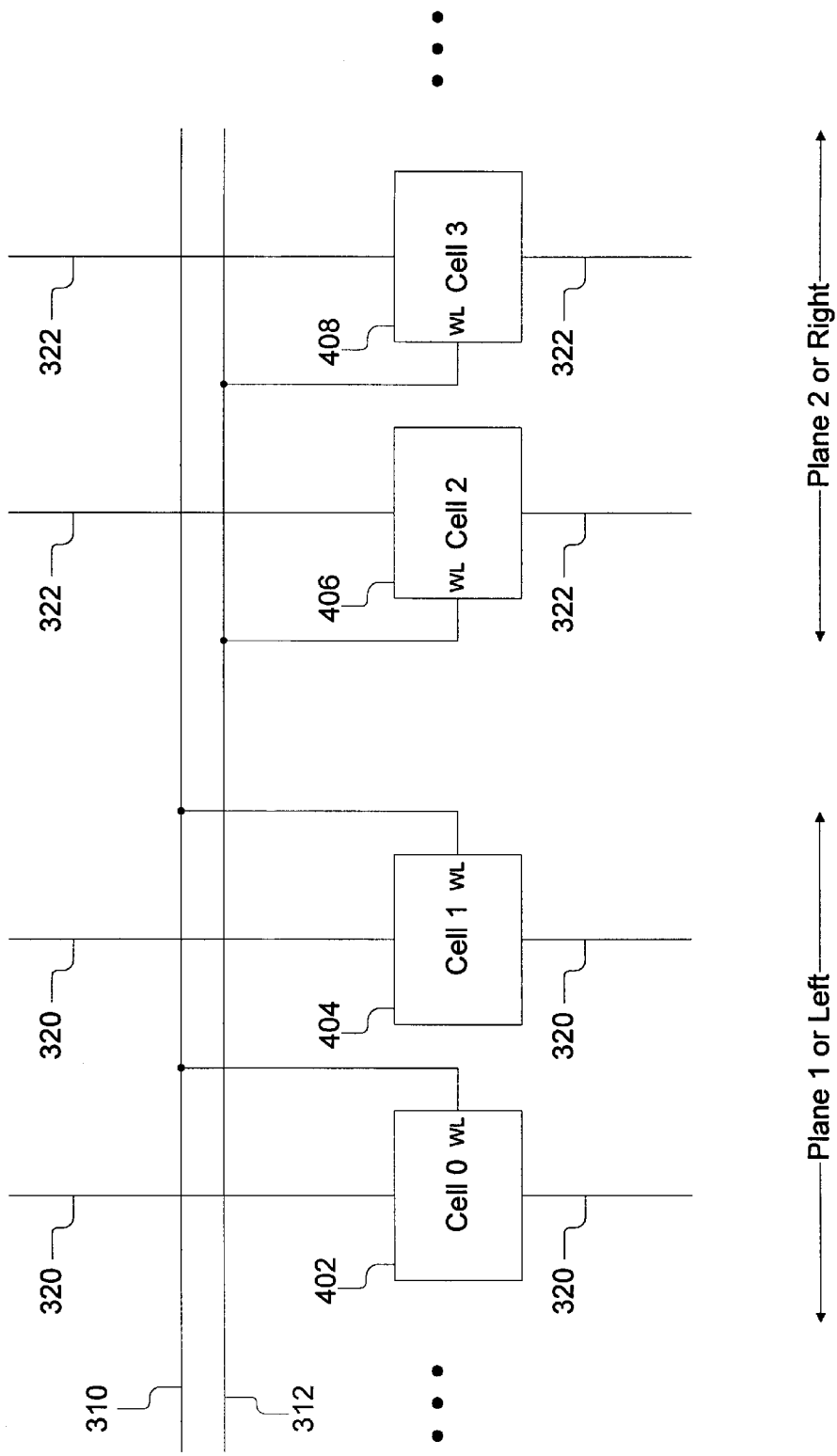
FIG. 4A is a block diagram of a plurality of cells of the multi-bank memory unit showing a word signal line pair and their coupling to the cells.

Referring now to FIG. 4A, a block diagram of a plurality of cells 402, 404, 406, 408 from the array 212 of the first embodiment of the multi-bank memory unit 200 and a word line pair 310, 312 and their couplings to the cells 402, 404, 406, 408 are shown. FIG. 4A shows only a small portion of a row 306 of cells 402, 404, 406, 408 that forms the array 212. Cells 402 and 404 represent the two bits of a word from the first plane or array of the combined memory array 212. Cells 406 and 408 represent the two bits of a word from the second plane or array of the combined memory array 212. As will be understood for those skilled in the art, the row extends both to the left and the right for less significant bits of the first plane and more significant bits of the second plane, respectively. As shown, each cell 402, 404 in the left plane has a word line input coupled to line 310 to receive signals from the first word-line driver 206. The cells 406, 408 of the right plane are similarly coupled, but to word line 312 to receive signals from the second word-line drivers 210. FIG. 4A also illustrates the coupling of pairs of bit lines 320 and 322 for each respective cell 402, 404 and 406, 408. Each cell 402, 404, 406, and 408 is coupled cells in the column 308 above and below the current row of cells 402, 404, 406, 408. Those skilled in the art will recognize how the cells of the second embodiment 200b are similarly coupled to pairs of word lines for each cell. This will become even further apparent when considered below with reference to FIG. 10B.

Figure 4B:
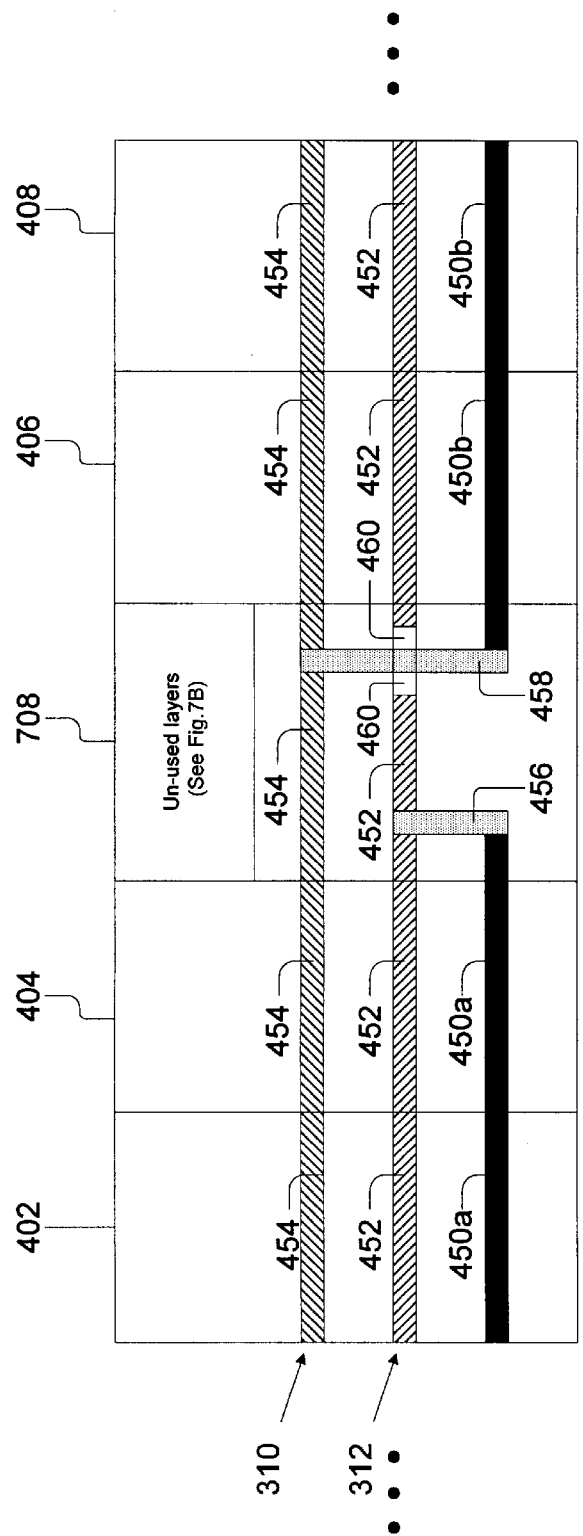
FIG. 4B is a cross-sectional view of portions of plurality of cells of FIG. 4A illustrating the word signal line pair, their coupling to the cells and the tilable aspects of word-line banking.

FIG. 4B shows the tilable elements for word-line banking in more detail. The present invention advantageously forms the word signal line pair 310, 312 as part of the cells 402, 404, 406, 408 thereby eliminating the need for any signal routing due to word line banking. For ease of understanding, the layers of the integrated circuit forming the cells 402, 404, 406, 408, bit lines 320, 322 and other portions of the array 212 are not shown in FIG. 4B, but rather these portions are represented as boxes 402, 404, 406, 408. FIG. 4B depicts a cross-sectional view of certain layers of the integrated circuit corresponding to the word signal lines 310, 312 and their coupling to the cells 402, 404, 406, 408 as represented by the polysilicon layers 450a, 450b. FIG. 4B also illustrates portion of a strap cell 708 between the cells 402, 404 of the left plane and the cells 406, 408 of the right plane. As can be seen in FIG. 4B, the word lines 310, 312 are advantageously formed of a plurality of segments 454, 452, respectively, that extend over each of the cells 402, 404, 406, 408, 708 in the array 212. The segments 454, 452 are preferably formed with the first and second metal layers. Thus, given a particular cell, simply by virtue of placement next to another cell, the word lines 310, 312 are formed. Between the left and right planes of the array 212, the strap cell 708 is provided. The strap cell 708 continues the word lines 310, 312 for coupling with adjacent cells 404, 406, and also connects the word lines 310, 312 to the word line inputs of the cells 402, 404, 406, 408 by coupling the word lines 310, 312 to appropriate segments of the polysilicon layers 450a, 450b. One segment 456 is formed within the strap cells 708 to connect the second word line 312 (segments 452) to the first polysilicon layers 450a. Similarly, a second segment 458 couples the first word line 310 (segments 454) to the polysilicon layers 450b. Within the strap cell 708 about the second segment 458, areas 460 are shown without shading and indicate an area where the segment 452 continues and connects the second word line 312 of cells 404 and 406, but does not make electrical contact with segment 458. Thus, the word lines 310,312 can be extended further and automatically for any number of additional memory cells 402, 404, 406, 408 and strap cells 708.

Figure 10A:
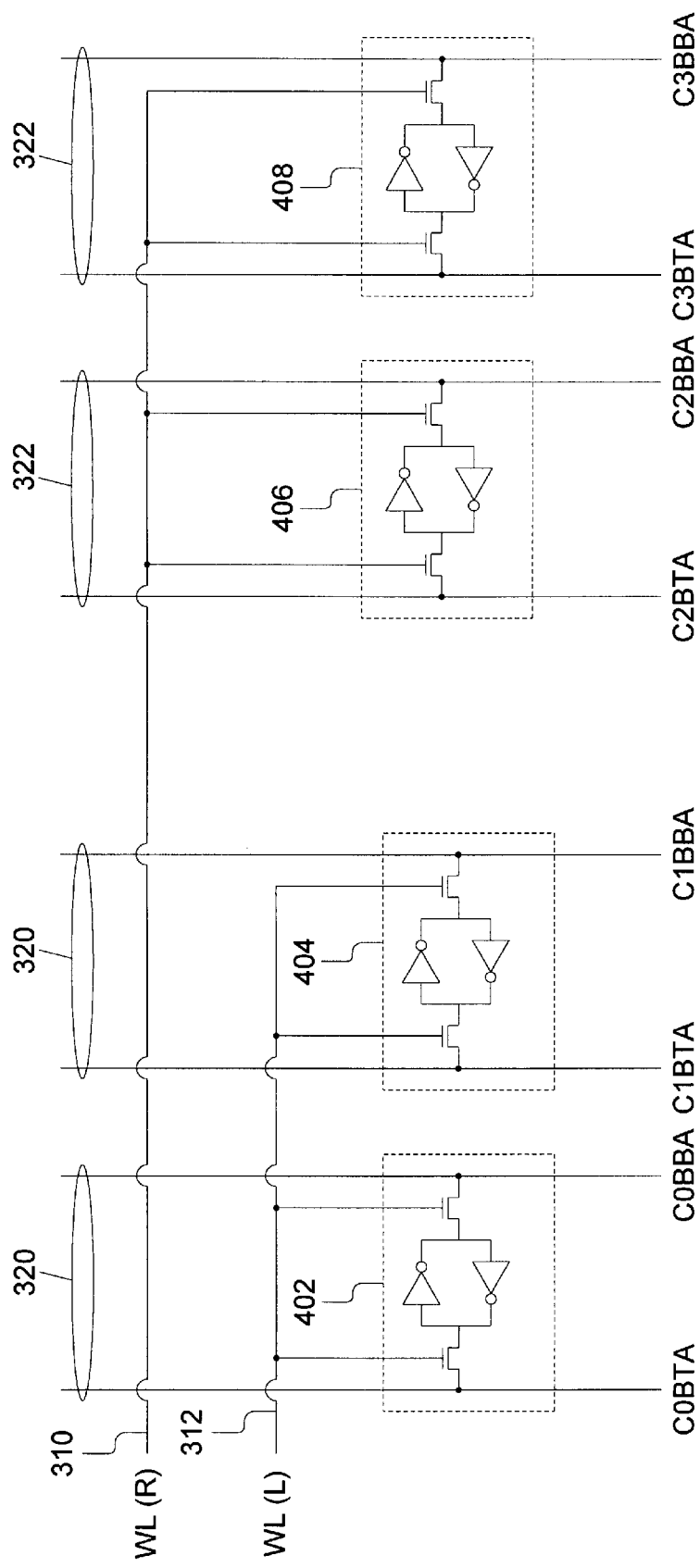
FIG. 10A is a block diagram of a first embodiment for the plurality of cells of the multi-bank memory unit where the cells are single port RAM cells.
Figure 10B:
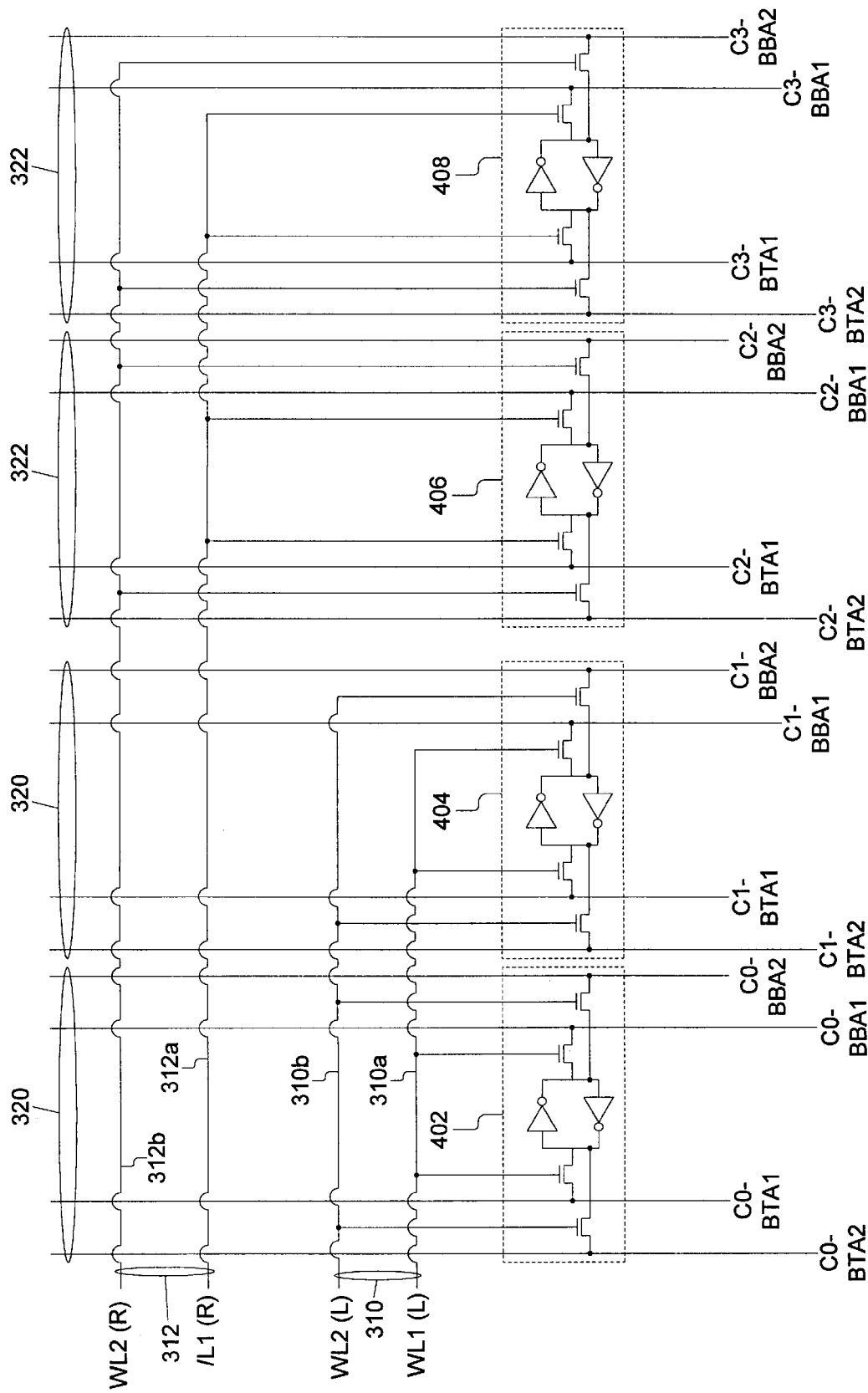
FIG. 10B is a block diagram of a second embodiment for the plurality of cells of the multi-bank memory unit where the cells are dual port RAM cells.
Figure 10C:
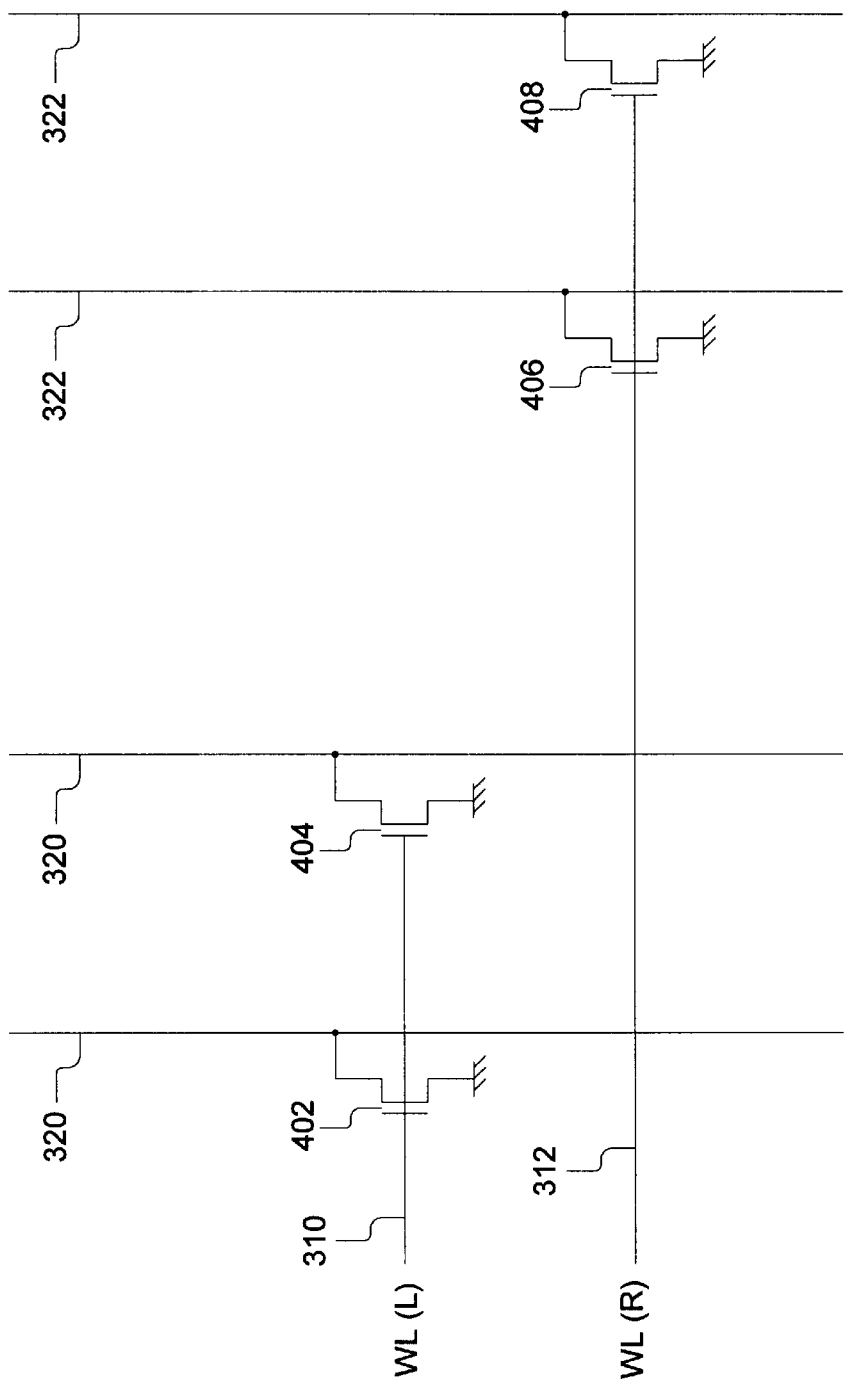
FIG. 10C is a block diagram of a third embodiment for the plurality of cells of the multi-bank memory unit where the cells are ROM cells.

Referring now to FIGS. 10A–10C, various embodiments for the cells 402, 404, 406, 408 of FIG. 4A are shown. FIG. 10A shows a first embodiment where each cell 402, 404, 406, 408 is a six transistor single port RAM cell. As shown in FIG. 10A, the first embodiment forms each cell 402, 404, 406, 408 from a pair of inverters and a pair of transistors. Each cell 402, 404, 406, 408 has a pair of bit lines (BTA, BBA) and a word line input for control. The respective pair of bit lines (BTA, BBA) correspond to signal line 320 or 322. The inverters of each cell 402, 404, 406, 408 are coupled input to output and the transistors couple the inverters to respective bit lines as shown. One transistor couples the input of one inverter and the output of the other inverter to a first bit line, BTA, and the second transistor couples the output of the same inverter and the input of the other inverter to the second bit line BBA. The gates of both transistors are coupled together and to a word line 310, 312 to receive signals from the corresponding word line driver. More specifically, the gates of the transistors for cells 402, 404 are coupled together and to word line 312 since they are in the left plane, and the gates of the transistors for cells 406, 408 are coupled together and to word line 310. Each cell also has a first and second bit line as noted above.

A second embodiment for the cells 402, 404, 406, 408 is shown in FIG. 10B. In the second embodiment for the cells 402, 404, 406, 408, each cell is a dual port RAM cell formed from eight transistors. Each cell 402, 404, 406, 408 preferably comprises a pair of inverters and four transistors. Each cell 402, 404, 406, 408 has a four of bit lines (BTA1, BTA2, BBA1, BBA2) and a pair of word line (WL1, WL2) inputs for control. Collectively, bit lines (BTA1, BBA1) and a word line (WL1) from one port, and bit lines (BTA2, BBA2) and the other word line (WL2) from other port for each cell. In this second embodiment, the four bit lines (BTA1, BTA2, BBA1, BBA2) correspond to line 320/322 and the first and second word lines 310a, 310b correspond to word lines 310 of FIG. 4A. The inverters of each cell 402, 404, 406, 408 are coupled input to output and the transistors couple the inverters to respective bit lines as shown. One transistor couples the input of one inverter and the output of the other inverter to a first bit line, BTA, for each port and the second transistor couples the output of the same inverter and the input of the other inverter to the second bit line, BBA, for each port. The gates of transistors of corresponding ports are coupled together and to a respective word line 310a, 310b, 312a, 312b to receive signals from the corresponding word line driver. Thus, the first and second cells 402, 404 are responsive to the two word lines WL1(L) and WL2(L), and the third and fourth cells 406, 408 are responsive to two word lines WL1(R) and WL2(R).

Referring now to FIG. 10C, a third embodiment for the cells 402, 404, 406, 408 is shown. In the third embodiment, each of the cells 402, 404, 406, 408 is a read-only memory cell formed from a single transistor. The gates of each transistor form the word line inputs to the cells 402, 404, 406, 408, with the gates of the first two cells 402, 404 coupled to the first word line 310 and the gates of the second two cells 406, 408 coupled to the second word line 312. Each transistor is coupled between ground and a respective bit line, which in this embodiment is a single line connector. This embodiment illustrates that the present invention advantageously may be used with any memory cell such as but not limited to EPROM, $E^2$PROM, Flash memory and DRAMs to yield lower power and area saving.

Figure 5:
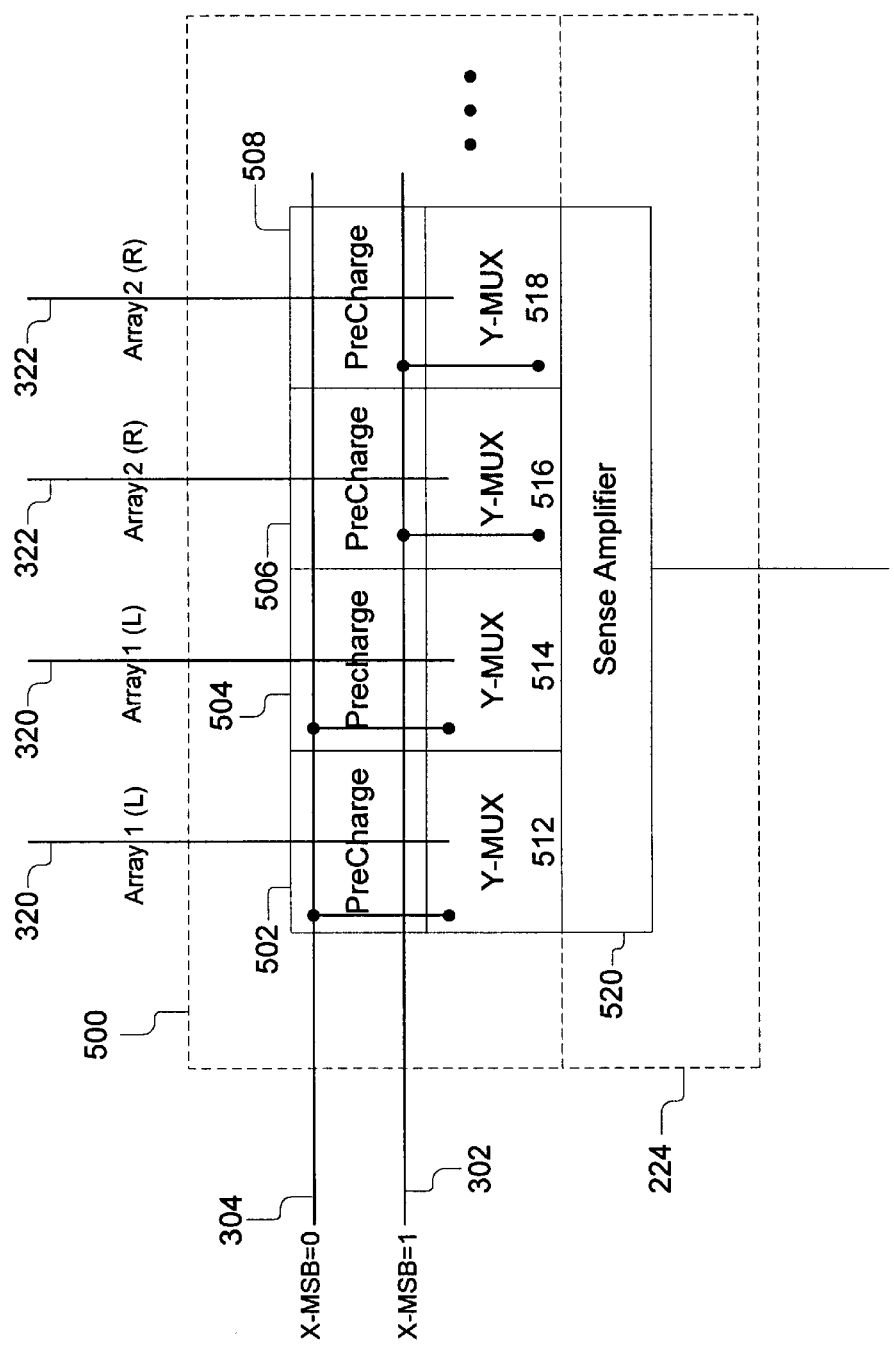
FIG. 5 is a block diagram of a portion of the multiplexer and pre-charging unit for use in the first embodiment of the multi-bank memory unit of the present invention.

As shown in FIG. 5, the first and second selection signals are also provided to the Y-multiplexer and pre-charging unit 222 via lines 304 and 302, respectively. FIG. 5 illustrates a block diagram of only a portion 500 of the Y-multiplexer and pre-charging unit 222 and part of the sense amplifiers and input/output circuit 224 for use the multi-bank memory unit 200 of the present invention. As shown, the Y-multiplexer and pre-charging unit 222 includes a plurality of pre-charging circuits 502, 504, 506, 508 and a plurality of Y-multiplexer circuits 512, 514, 516, 518. Each pre-charging circuit 502 corresponds to a Y-multiplexer circuit 512 for reading and writing a column of the array 212. For cells in a given column, they are read and written using a corresponding Y-multiplexer, pre-charging unit, and sense amplifier. For example, cells using the first bit line 320 would utilize pre-charging unit 502, Y-multiplexer 512 and sense amplifier 520. Similarly, cells using the second bit line 322 would utilize pre-charging unit 506, Y-multiplexer 516 and the same sense amplifier 520. The sense amplifiers and input/output circuit 224 is only partially shown as one sense amplifier 520 in FIG. 5 even though the sense amplifier and input/output circuit 224 includes a plurality of sense amplifiers. The present invention advantageously reduces the number of sense amplifiers by more than half as compared with the prior art since a single sense amplifier can be used for multiple columns of the array 212. This number could be any number columns from two to n, preferably powers of two, despite FIG. 5 only showing a single sense amplifier for four columns: two columns from the left array and two columns from the right array.

The first selection signal on line 304 is coupled to the pre-charging circuits 502, 504, and the Y-multiplexer circuits 512, 514 corresponding to columns of the left array. In a like manner, the second selection signal on line 302 is coupled to the pre-charging circuits 506, 508, and the Y-multiplexer circuits 516, 518 corresponding to columns of the right array. These lines 304, 302 are used to control which of the pre-charging circuits 502, 504, 506, 508 and Y-multiplexer circuits 512, 514, 516, 518 are enabled for operation. Since the first and second selection signals 304, 302 are only alternatively asserted, either pre-charging circuits 502, 504 and the Y-multiplexer circuits 512, 514 are operational or pre-charging circuits 506, 508 and the Y-multiplexer circuits 516, 518 are operational. Therefor, according to the architecture of the present invention half of the array is guaranteed to not be in used, power normally used for such pre-charging circuits can be saved by effectively disabling their use via control lines 304 and 302. Moreover, as noted only a single sense amplifier is need to read from four different columns 308 of the array 212. As shown, sense amplifier 520 is used to read either cells from the first plane via Y-multiplexer 512, 514 or cells from the second plane via Y-multiplexer 516, 518. This architecture is particularly advantageous because of the area savings due to eliminating unneeded sense amplifiers and due to the power savings arising for alternate used of the pre-charging circuits. The savings in power is significant because the sense amplifiers and pre-charging/discharging of bit lines account for most of the power consumption of the array 212.

It should be noted that for the embodiment where the array 212b is comprised of dual port memory cells, each cell will provide four bit lines to the Y-multiplexer and pre-charging circuit 222b and thus the corresponding portion 500b of the Y-multiplexer and pre-charging circuit 222b would provide two sense amplifiers and basically be the circuit shown in FIG. 5 duplicated with the control lines 304, 302 and data lines 320, 322 appropriately coupled corresponding to FIG. 3B and FIG. 10B as will be understood to one skilled in the art.

Referring now to FIGS. 6A–7B, a second embodiment of the present invention will be described. The second embodiment of the present invention provides a multi-bank memory unit 600 that utilizes word-line banking as has been described above with reference to FIGS. 2–5 and 10A–10C above, but also utilizes bit-line banking. Although the second embodiment of the present invention will now be described in this context, those skilled in the art will recognize that bit-line banking of the second embodiment could be implemented without inclusion of word-line banking.

Figure 6A:
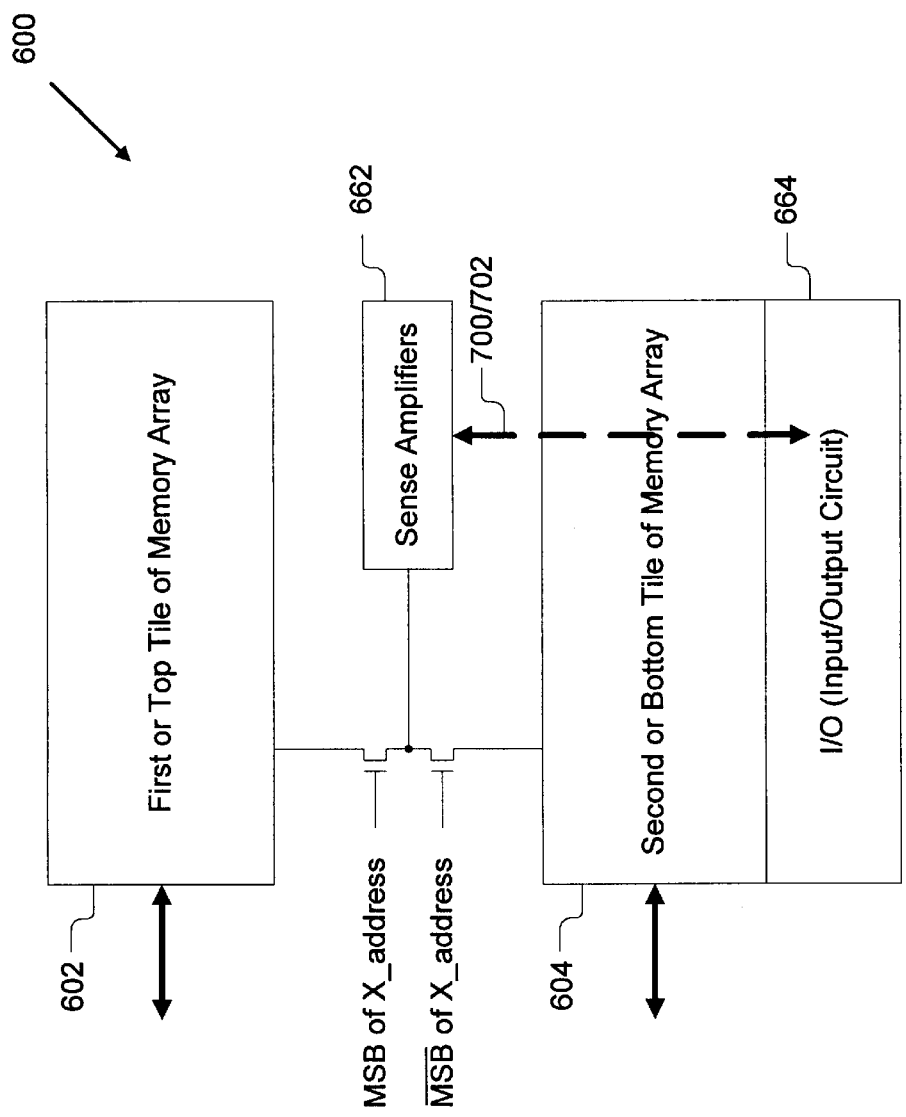
FIG. 6A is a high-level block diagram of a second and preferred embodiment of a multi-bank memory unit using tilable word-line banking, tilable bit-line banking and constructed according to the present invention.

FIG. 6A is a high-level block diagram of the second embodiment of a multibank memory unit 600 using bit-line banking and constructed according to the present invention. FIG. 6A conceptually illustrates that the bit-line banking architecture of the second embodiment is tilable. In other words, the bit-line banking architecture provides for simple connectivity between arrays without messy and complicate routing of signal lines using place and route tools. FIG. 6A also shows some key features of bit-line banking and the tiling architecture. As shown in FIG. 6A, the first tile of memory array 602 shares a data input and output path with the second tile of memory array 604. The horizontal lines of FIG. 6A represent control signals provided to each tile 602, 604. The input/output path provided for both top and bottom tiles 602, 604 exits at a single area near the bottom of the memory unit 600 from the input/output circuit 664. More particularly, the architecture of the present invention provides a top tile 602 and bottom tile 604 that are similar and each include an X-decoder, a first word-line driver, a second word-line driver, a first combined memory array, a Y-mux/pre-charge circuit and a reference column. The tiles 602, 604 differ only in placement of the Y-mux/pre-charge circuit relative to their respective arrays. The top tile 602 positions its Y-mux/pre-charge circuit near the bottom of the tile and the bottom tile 604 positions its Y-mux/pre-charge circuit near the top of the tile to enable shared use of sense amplifiers 662 between the top and bottom tiles 602, 604. The pair of transistors controlled by a bit of the address signal, preferably the most significant bit, alternatively couples either the top tile 602 or the bottom tile 604 to respective sense amplifiers 662 and provides another level of multiplexing. Those skilled in the art will recognize that while only a single transistor pair is shown in FIG. 6A, a plurality of pairs are provided such as one pair for each bit line. The other feature of this second embodiment 600 is that the sense amplifiers 662 are coupled to the input/output circuit 664 across the bottom tile 604 without any significant increases in area for routing bit lines as indicated by the dashed line 700/702.

Figure 6B:
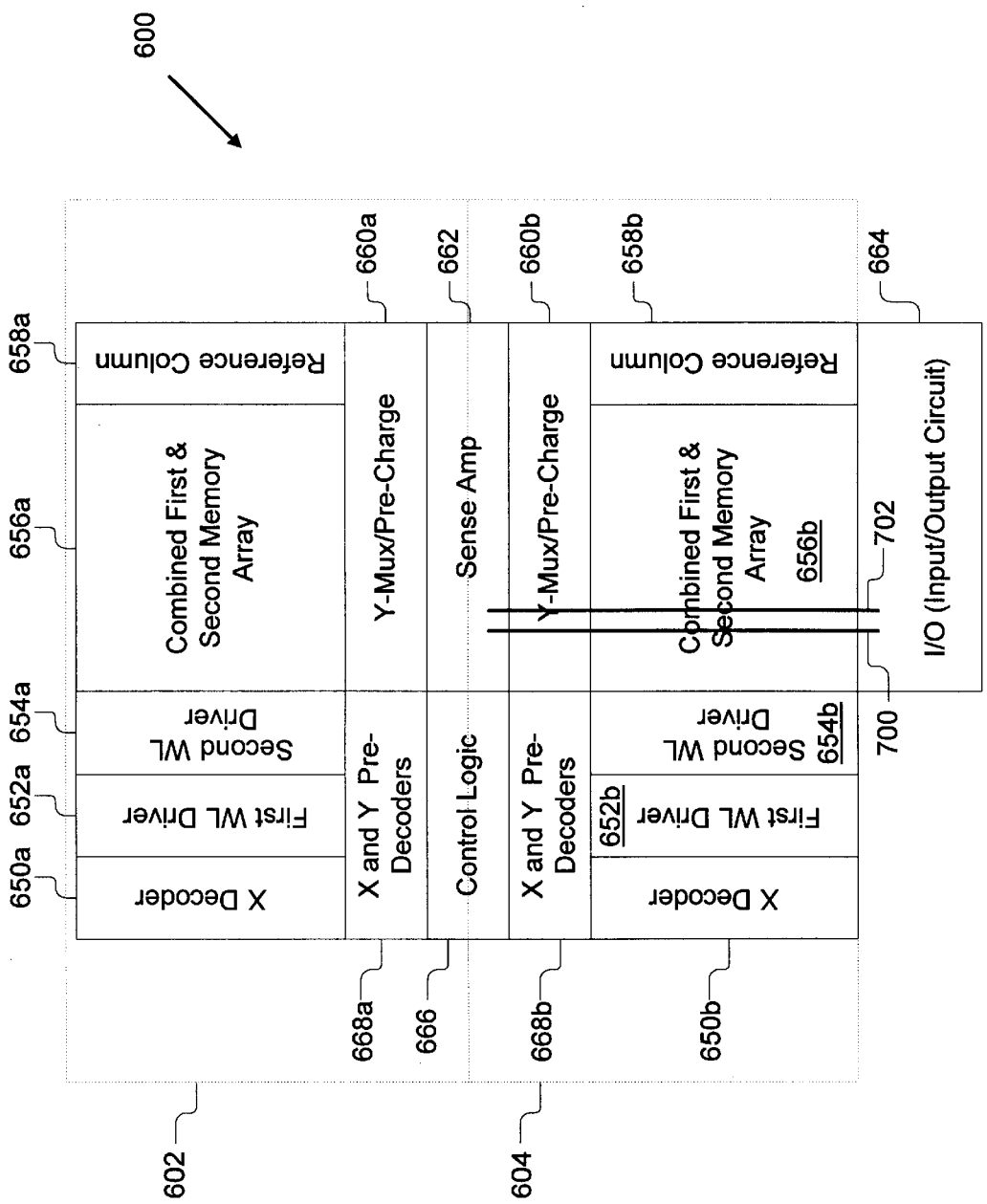
FIG. 6B is a block diagram of a second embodiment of a multi-bank memory unit according to the present invention showing the lines for coupling the sense amplifiers to the I/O circuitry.

Referring now to FIG. 6B, a block diagram of the second embodiment of a multi-bank memory unit 600 shows the placement of the components of the memory unit 600 and highlights signal lines 700, 702 for coupling the sense amplifiers 662 to the I/O circuitry 664. For convenience and ease of understanding, like reference numerals have been used for like components that have the identical or similar functionality. The two tiles 602, 604 of the second embodiment of the present invention are shown in FIG. 6B by the dotted lines. As can be seen, the tiles 602, 604 are similar with the first tile 602 including an X-decoder 650a, a first word-line driver 652a, a second word-line driver 654a, a first combined memory array 656a, a Y-mux/pre-charge circuit 660a and a reference column 658a. Similarly, the second tile 604 includes an X-decoder 650b, a first word-line driver 652b, a second word-line driver 654b, a first combined memory array 656b, a Y-mux/pre-charge circuit 660b and a reference column 658b. The tiles 602, 604 are essentially mirror images of each other about a line through the middle of the sense amplifiers 662 and excluding an X-pre-decoder 666 and the input/output circuit 664. The tiles 602, 604 share the X-pre-decoder 666, a control and Y-pre-decode logic, sense amplifiers 662 and I/O circuitry 664. Each of these shared components is advantageously positioned proximate the other components with which it interacts to eliminate signal line routing. Each of the components including the X-decoder 650a, 650b, a first word-line driver 652a, 652b, a second word-line driver 654a, 654b, a first combined memory array 656a, 656b, a Y-mux/pre-charge circuit 660a, 660b, a reference column 658a, 658a sense amplifiers 662, and I/O circuits 664 have similar functionality to that described above for the first embodiment. While the tiles 602, 604 are similar, it should be noted that the position of the Y-mux/pre-charge circuit 660b is moved above the array 656b to eliminate routing and signal lines and allow all the sense amplifiers 662 to be placed in a single location for economies of scale and multiple use of the sense amplifiers 662. More specifically, respective columns from the top tile 602 and the bottom tile 604 share a sense amplifier an input/output lines, thereby providing additional power and area savings over using word-line banking alone. The present invention advantageously reduces the power consumed to one fourth that consumed by the prior art since the reduced amount of pre-charging/discharging of bit lines, and the number of sense amplifiers is reduced by a factor of four.

In contrast to the first embodiment, this second embodiment utilizes control logic 666, a first X-pre-decoder and Y-pre-decoder 668a, and a second X-pre-decoder and Y-pre-decoder 668b, that provide the appropriate control signals to each tile 602, 604 as will be understood to those skilled in the art. More importantly, however, the second embodiment 600 provides a method for connecting the sense amplifiers 662 to the I/O circuits 664 using tilable connection elements that extend over the strap cell 708, and therefore without having to allocate significant circuit area for the routing lines. Thus, banking between the top and bottom tiles 602, 604 is achieved automatically, without routing. This is shown and represented by lines 700, 702 that are two exemplary lines of many connecting the sense amplifiers 662 to the I/O circuits 664. These lines 700, 702 are preferably constructed by using heretofore unused areas (See FIG. 4B) of the third and fourth metal layers present across the entire multi-bank memory unit 600 above the strap cells 708 used to achieve word line banking. This is particularly advantageous because this use of metal layers in tilable cells, the strap cells 708, without any routing allows the reduction in sense amplifiers 662 noted above.

Figure 7A:
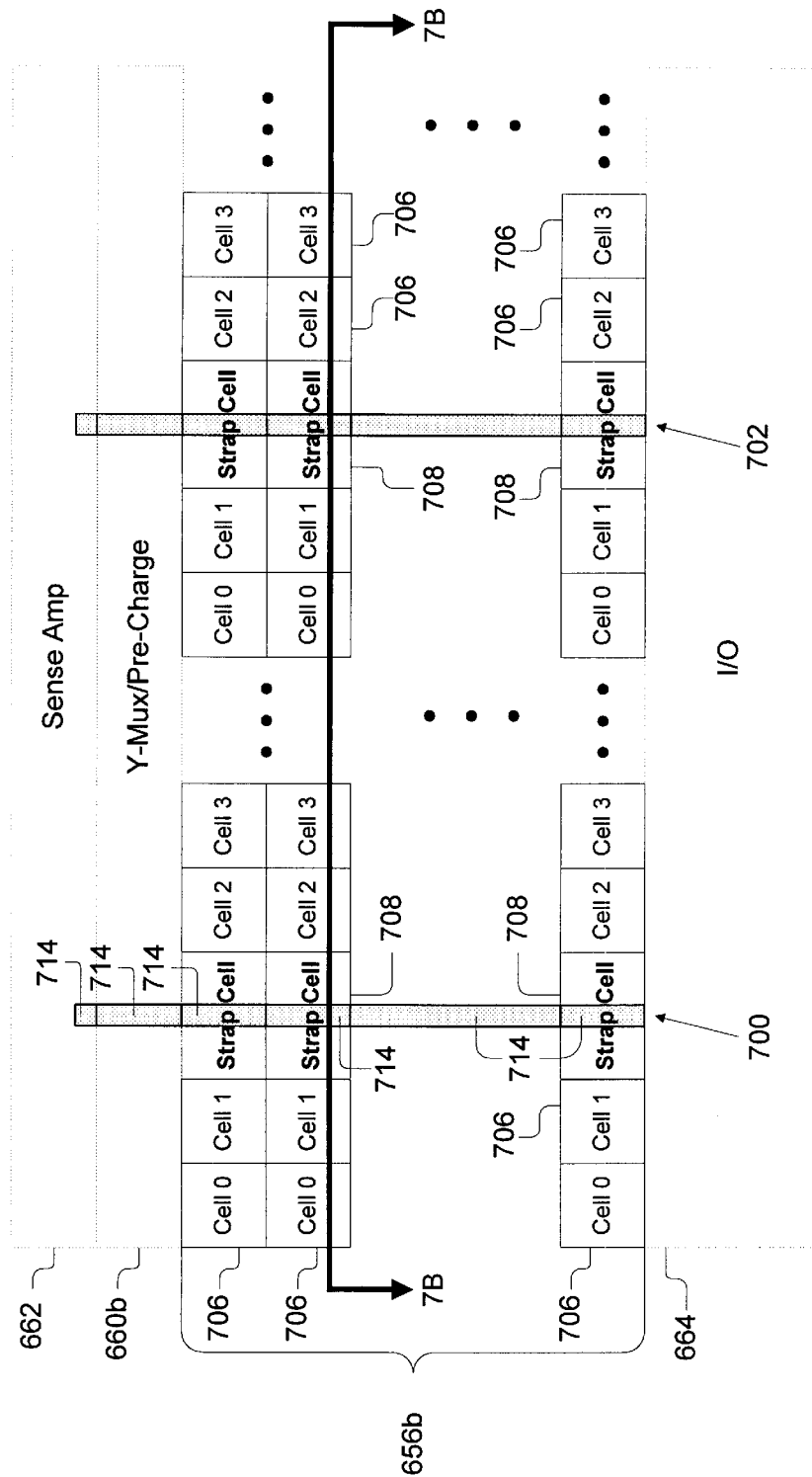
FIG. 7A is a block diagram of the sense amplifiers and the I/O circuitry for the multi-bank memory unit of FIG. 6B.

As shown in further detail in FIG. 7A, the novel approach for coupling the sense amplifiers 662 and the I/O circuitry 664 preferably uses a metal layer over the strap cells 708 (which are already present for word line banking) in the bottom tile 604 or array 656*b*. FIG. 7A illustrates portions of the sense amplifiers 662, the Y-Mux/Pre-charge circuit 660*b* for the bottom tile 604 and the I/O circuit 664. In addition, portions of the second combined memory array 656*b* are shown. As can be seen, each row of cells 706, 708 includes a plurality of cells 706 for storing data. Between words of data cells 706, the array 656*b* provides unique word line strap cells 708 used to achieve word line banking (WLB). In these word line strap cells 708, the upper levels of metal would typically go unused. However, in accordance with the present invention, the upper metal layer, preferably metal layer 4, is provided on the top of each of the word line strap cells 708, thereby forming a line connecting the sense amplifiers 662 and the I/O circuitry 664 when a column of such unique word line strap cells 708 are used for the entire column of the array 656*b*. Those skilled in the art will recognize that other metal layers that are not used such as metal layer 3 may be used instead of metal 4. As best shown in FIG. 7A, each of the lines 700, 702 is a tilable interconnect and is formed from a plurality of segments 714 that are adapted to the size of the cell 708 and formed as part of each word line strap cell 708. In other words, each of the word line strap cells 708 include a tilable segment 714 such that merely by placement of the strap cells 708 in a column as shown from the top view of FIG. 7A, the signal lines 700, 702 are automatically formed, do not require any additional area, and do not require routing tools for their generation. This concept can be extend for areas in the I/O circuit and over the Y-Mux/Pre-charge circuit 660*b* as shown in FIG. 7A. With such an approach no additional area need be provide to pass signals from the sense amplifiers 662 and the I/O circuitry 664 even though the signal lines are passing over the array 656*b*.

Figure 7B:
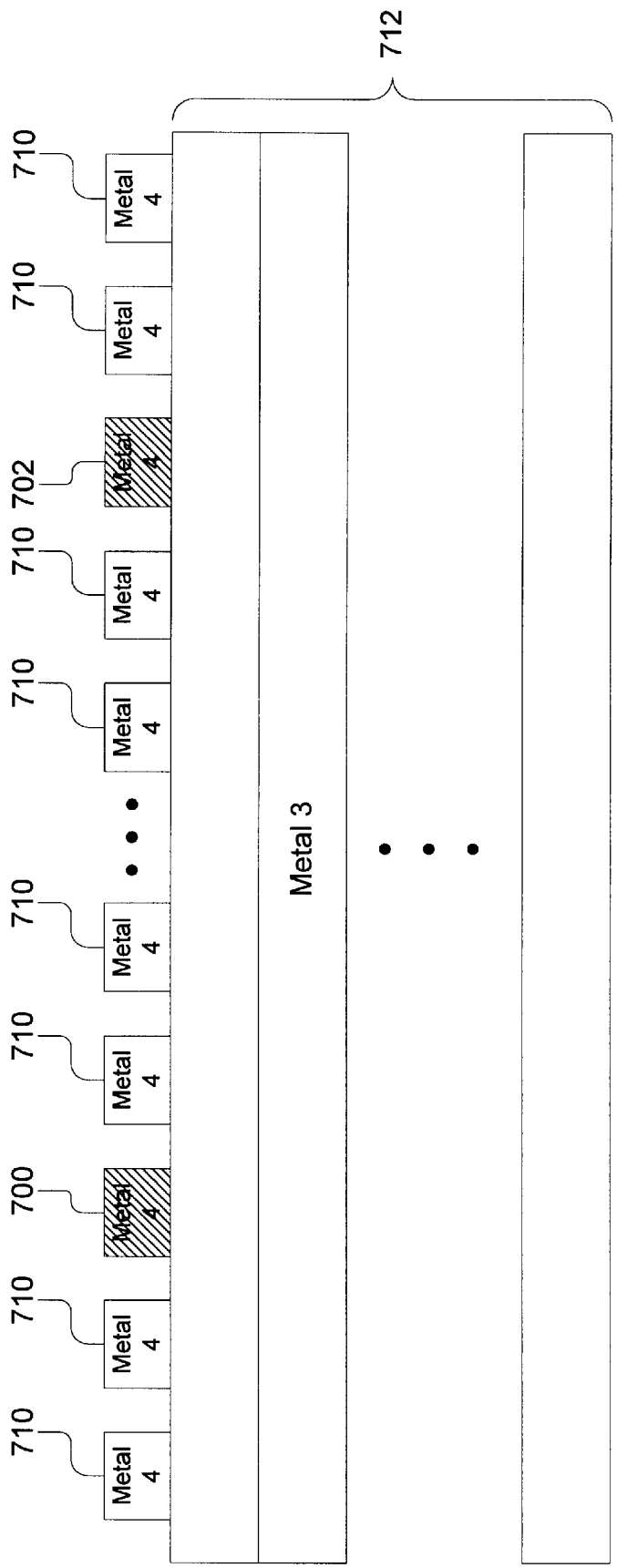
FIG. 7B is a cross-sectional view of the sense amplifiers and the I/O circuitry for the multi-bank memory unit of FIG. 6B showing the tilable lines for coupling the sense amplifiers to the I/O circuitry.

This novel concept of the present invention is further illustrated in FIG. 7B. FIG. 7B illustrates a cross-sectional view of the lines 700 and 702 connecting the sense amplifiers 662 and the I/O circuitry 664 taken along line 7B—7B of FIG. 7A. As shown in FIG. 7B, the metal 4 layers are used to provide a connecting path across the entire array. The lines 700 and 702 are above the metal 3 layer and other layers 712 forming the cells 706, 708 and typically used in VLSI. Even when the metal 4 layer is used for bit lines above cells 706 as shown by the additional metal layers 710, the lines 700, 702 do not interfere or present any routing problems. Moreover, as will be understood to those skilled in the art, the lines 700, 702 are particularly flexible for accommodating any variety of word sizes and memory sizes. Since strap cells 708 are need between each word, there is a general correspondence between the number of lines need to coupled the sense amplifiers 662 and the I/O circuitry 664, and the size of the second combined memory array 656*b*. While showing only a single signal line in FIG. 7B, those skilled in the art will recognize that line 700 may be divided into a plurality of signal lines for other embodiments where multiple lines are needed between to coupled the sense amplifiers 662 to the input/output circuit 664.

The second embodiment of the present invention detailed above is particularly advantageous over the prior art for a number of reasons, especially from a memory compiler perspective. First, this embodiment requires a quarter of the power compared with prior art with only a modest increase in area for the additional Y-MUX and pre-charge logic 660*b* for the second combined array 656*b*. Second, the speed of the memory array 600 is reduced in half because of the reduced capacitance on the word lines and bit lines. Third, the memory design process is greatly simplified because of the use of tilable cell designs that do not require routing and eliminate the need for place and route tools. Thus, the second embodiment of the invention is particularly advantageous over the prior art.

Figure 1:
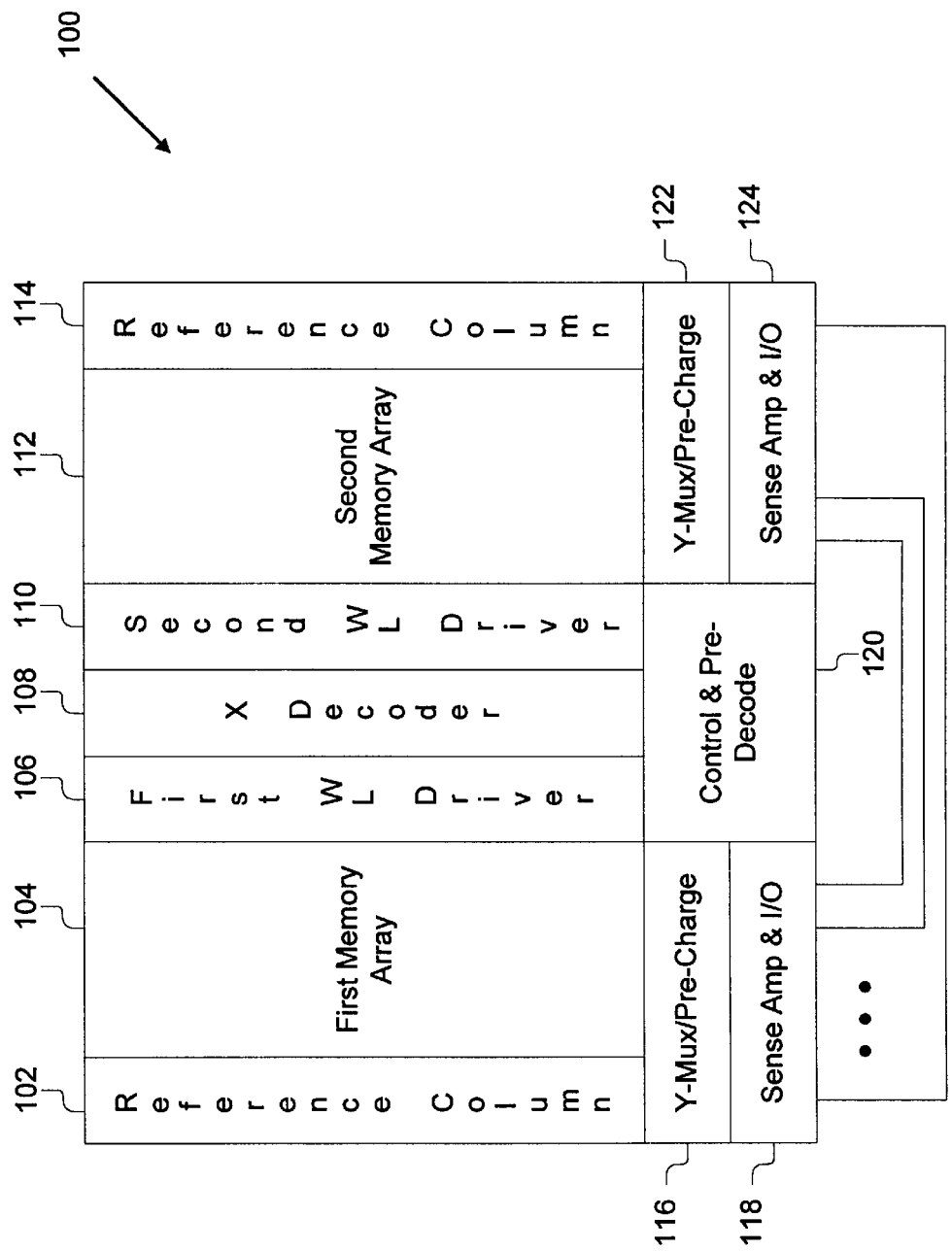
FIG. 1 is a block diagram of a prior art multi-bank memory unit.

Referring now to FIGS. 8A–9C, a third embodiment of the present invention will be described. The third embodiment of the present invention provides a multi-bank memory unit 800 that utilizes word-line banking and bit-line bank as has been described above with reference to FIGS. 2–7B and 10A–10C above, and in addition utilizes convention banking as discussed with reference to FIG. 1 and a novel tilable interconnect structure 810. Although the third embodiment of the present invention will now be described in this specific context, those skilled in the art will recognize that either word-line banking of the first embodiment or bit-line banking of the second embodiment could be used alone with conventional banking, or that the novel tilable interconnect structure could be used alone with any of the above teachings.

Figure 8A:
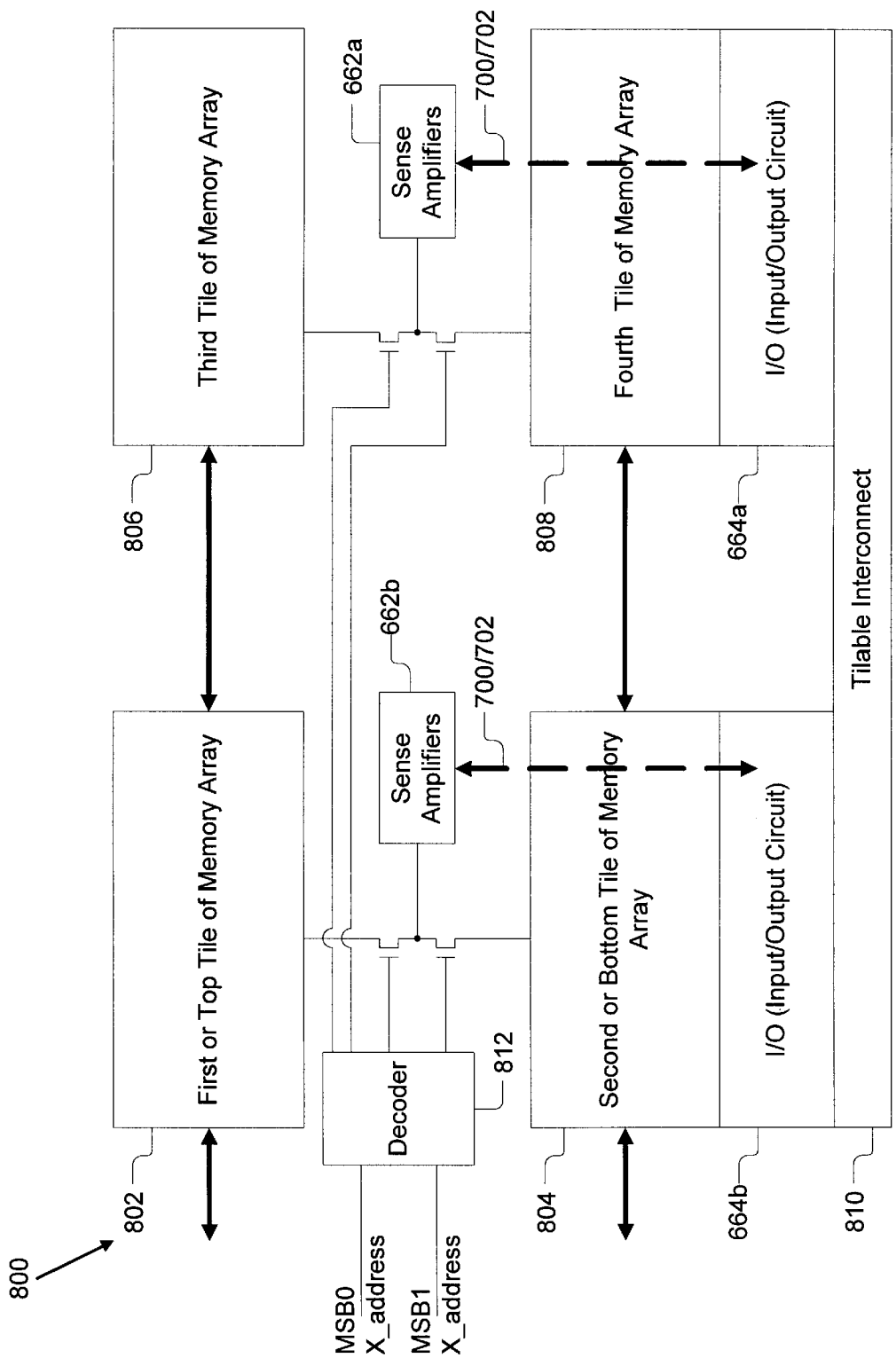
FIG. 8A is a high-level block diagram of a third embodiment of a multi-bank memory unit using both tilable bit-line banking and tilable word-line banking.

FIG. 8A is a high-level block diagram of the third embodiment of a multi-bank memory unit 800 using word-line banking, bit-line banking and conventional banking. The architecture shown in FIG. 8A also relies on the novel tilable interconnect structure 810 of the present invention that is described more detail below with reference to FIGS. 9A–9C. FIG. 8A illustrates that the banking architecture of the third embodiment is tilable like the previous embodiments. In other words, this banking architecture provides for simple connectivity between arrays without using place and route tools. However, in this third embodiment, the present invention provides an elegant method for combining the signals from a pair of I/O circuits 664*a*, 664*b*. As shown in FIG. 8A, the first tile 802 of the memory unit 800 shares a data input and output path with the second tile 804 of the memory unit 800 through I/O circuit 664*b*. Similarly, the third tile 806 of the memory unit 800 shares a data input and output path with the fourth tile 808 of the memory unit 800 through I/O circuit 664*a*. The input/output paths provided from the second tile 804 and the fourth tile 808 are combined to provide a single path for data input and output for all four tiles 802, 804, 806, 808 by the tilable interconnect structure 810. The third embodiment of the memory unit 800 also includes a decoder 812 that receives the two most significant X address bits, MSB0, MSB1, and decodes them to select which of the tiles 802, 804, 806, 808 will be coupled to the sense amplifiers 662*a*, 662*b*. As will be better understood with reference to FIG. 8B, the first and second tiles 802, 804 are a mirror image of the third and fourth tiles 806, 808. Both the first and second tiles 802, 804 or the third and fourth tiles 806, 808 are implemented similar to the second embodiment described above with reference to FIGS. 6A–7B.

Figure 8B:
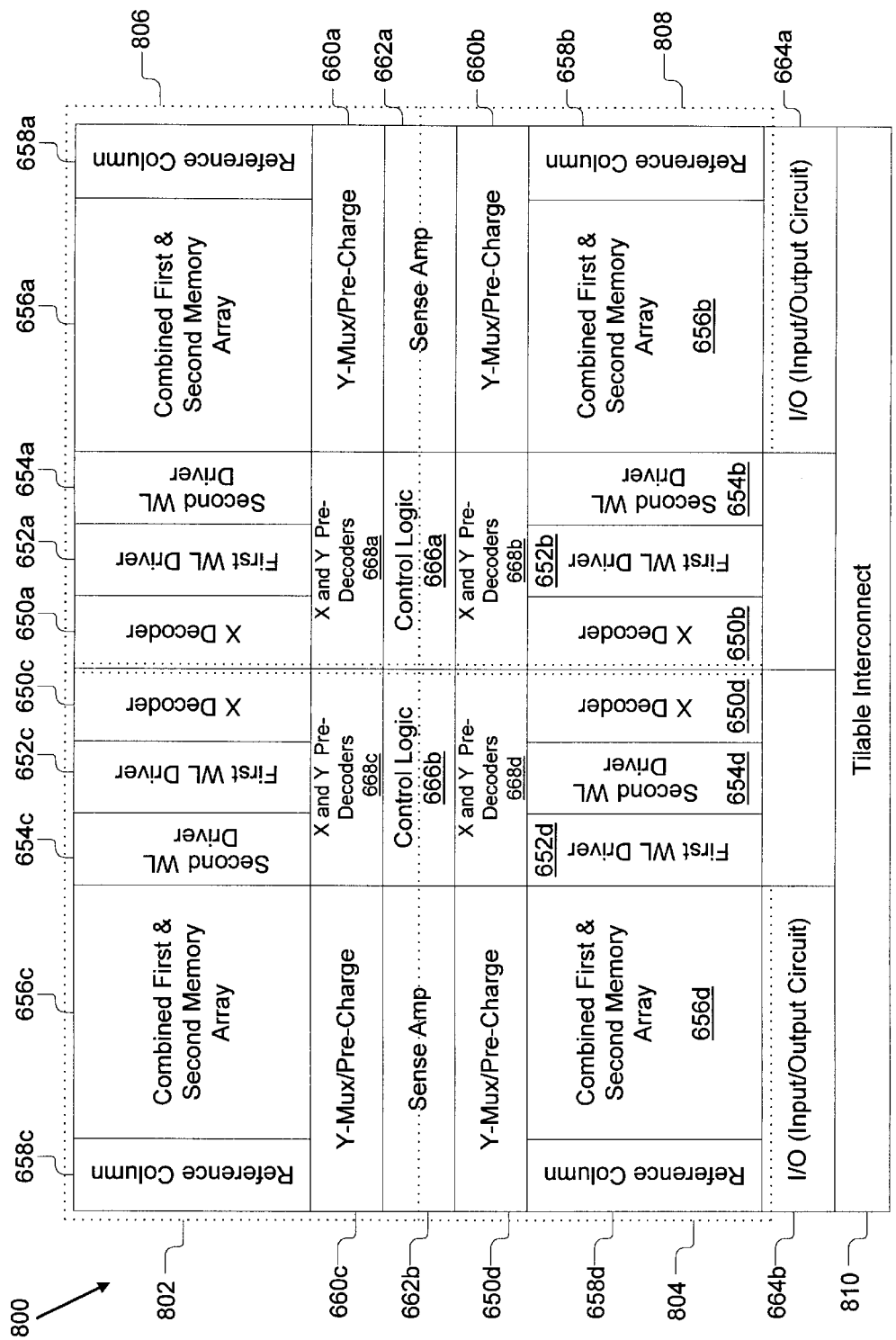
FIG. 8B is a block diagram of a third embodiment of the multi-bank memory u nit according to the present invention.

Referring now to FIG. 8B, a block diagram of the third embodiment of a multi-bank memory unit 800 in accordance with the present invention is shown. FIG. 8B shows the placement of the components of the memory unit 800 and highlights the portions forming each tile 802, 804, 806, 808. For convenience and ease of understanding like reference numerals have been used for like components that have the identical or similar functionality. The four tiles 802, 804, 806, 808 of the third embodiment of the present invention are shown in FIG. 8B by the dotted lines. As can be seen the tiles 806, 808 are preferably similar to the first and second tiles 602, 604 of the second embodiment, respectively. Since the functionality, interconnection and operation of those tiles 602, 604 have been described above, that description will not be repeated here. Nonetheless, those skilled in the art will recognize that there are additional control signal routing and multiplexing between the tilable interconnect 810 and control logic 666*a*, 666*a*, the X-pre-decoders and Y-pre-decoders 668*a*, 668*b*, 668*c*, 668*d* that is not shown in FIG. 8B. However, the area and power penalty for such control signal coupling is minimal compared with the area and power savings due to banking according to this embodiment 800 of the present invention. The two additional tiles 802, 804 of the third embodiment 800 provide similar functionality and differ only in the placement of their respective components to each other. As can be seen, tiles 802 and 804 are a mirror image of tiles 806 and 808 about a vertical line down the center of memory unit 800. This embodiment 800 of the present invention achieves eight times banking compared to a non-banked memory unit. Furthermore, this embodiment 800 requires an eighth of the power as compared with conventional banking schemes and prior art designs. Finally, this embodiment 800 has a significant speed enhancement as well as the other advantages described above with the previous embodiments.

The third embodiment of the multi-bank memory unit 800 is possible in part due to the addition of the tilable interconnect structure 810. The tilable interconnect structure 810 is coupled to and positioned adjacent and below the first and second I/O circuits 664*a*, 664*b*. The tilable interconnect structure 810 provides the connection of the memory unit 800 to control signal lines and data input and output lines.

Figure 9A:
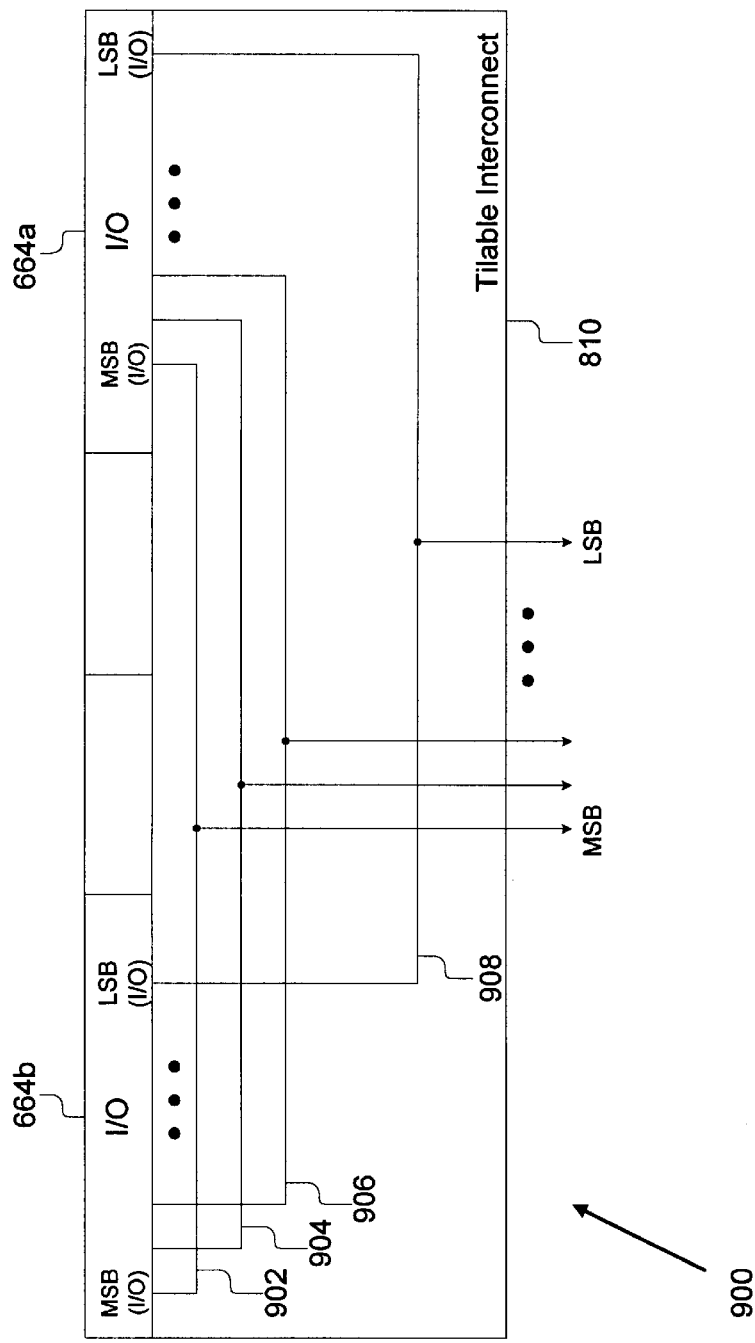
FIG. 9A is a block diagram of a tilable interconnect of the third embodiment schematically showing the combination of outputs from two I/O blocks.

The tilable interconnect structure 810 is shown in more detail with reference to FIGS. 9A–9D. FIG. 9A is a block diagram of the first and second I/O circuits 664*a*, 664*b* and the tilable interconnect structure 810 schematically showing the combination of outputs from two I/O circuits 664*a*, 664*b*. As can be seen in FIG. 9A, the tilable interconnect structure 810 provides both the electrical connection and a multiplexing function between corresponding bits from the first and second I/O circuits 664*a*, 664*b*. In other words, the signal line for a bit of the first I/O circuit 664*a* is coupled to and multiplexed with the signal line for a respective bit of the second I/O circuit 664*b*. This is similarly done for each I/O bit up to and including the MSB I/O. As can be seen in FIG. 9A, the interconnect 810 is advantageous because the connections are formed from metal layers having an equal length horizontally across the tile 810 thereby ensuring that all the lines 902, 904, 906, 908 in the input/output structure 810 will have the same capacitive loading. This means that a single design for each horizontal connection can simply be duplicated and repositioned for each I/O bit provided for in the input and output. Thus, only one tilable cell 930–936 is needed for the memory unit 800. While only a few of the connections are shown those skilled in the art will recognize that the any number of signal lines may be accommodated, and it is dictated by the bit width of the I/O path. While not shown, the control logic 666*a*, 666*b* could have a similar structure over the tilable interconnect structure 810 as will be understood to those skilled in the art.

Figure 9B:
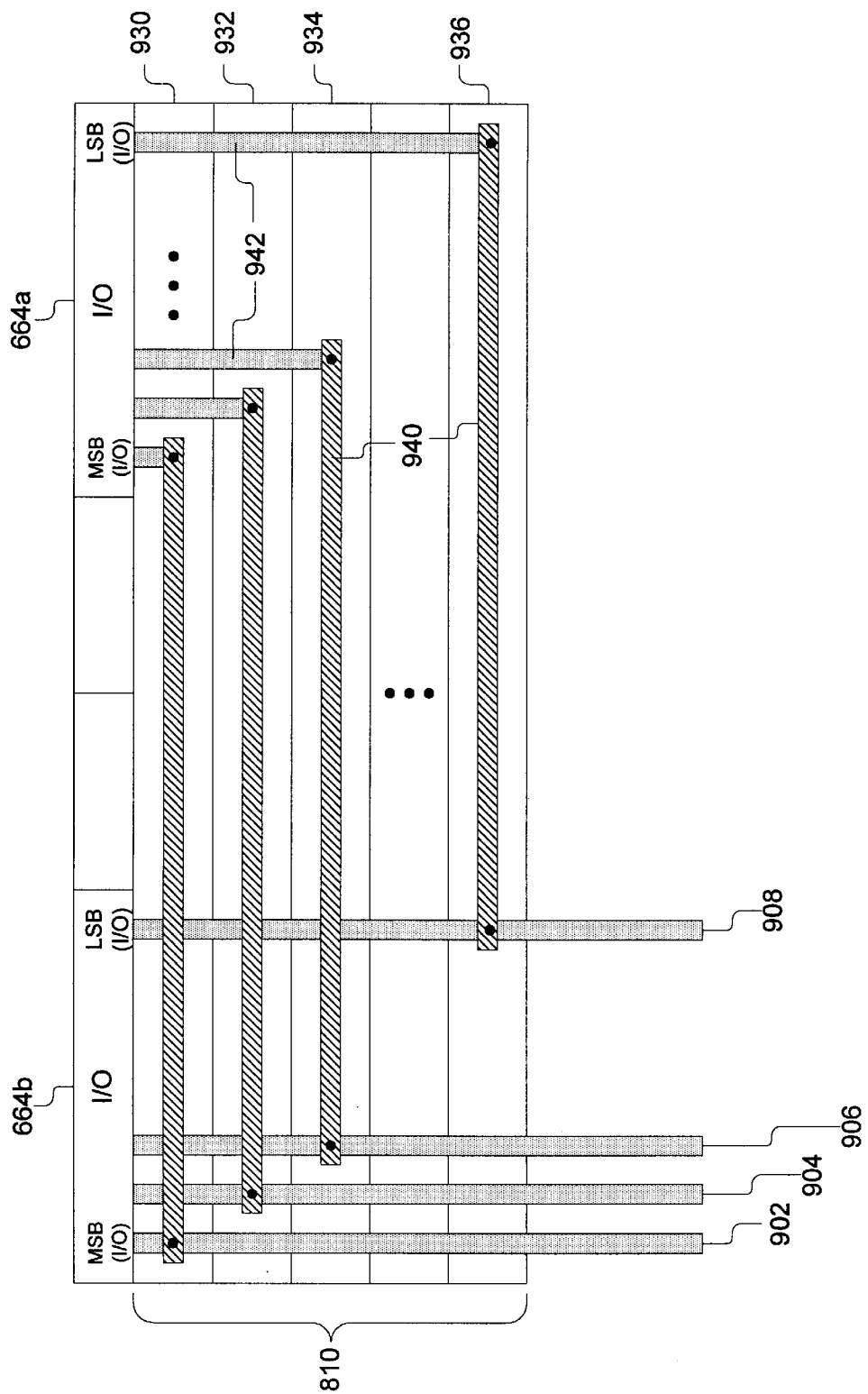
FIG. 9B is a top view block diagram of one embodiment for the tilable interconnect using a single metal layer.

FIG. 9B is a block diagram of one embodiment for the tiles 930–936 forming the tilable interconnect structure 810. FIG. 9B shows the tilable interconnect structure 810 in more detail including the use of different metal layers for different portions of the I/O data path. The tilable interconnect structure 810 shown in FIG. 9B uses a semiconductor process that provides a plurality of metal layers that is preferably four in number. FIG. 9B shows a top view of the tilable interconnect structure 810 with different layers of metal shown with different shading. The dots at the intersection of different metal layers indicate the formation of an electrical connection between metal layers. As shown a different metal layers are used to form each I/O bit signal path 902, 904, 906, 908. In this embodiment, a plurality of tiles 930, 932, 934, 936 are used along with different layers of metal, and the tiles 930, 932, 934, 936 divide the tilable interconnect structure 810 into horizontal strips. Each of the tiles 930, 932, 934, 936 here is used to combine an I/O bit signal line from each I/O circuit 664*a*, 664*b*. For example, if the I/O path were 32 bits, 32 such tiles 930, 932, 934, 936 would be required even though only four are illustrated. Each I/O bit signal path 902, 904, 906, 908 is preferably formed of a horizontal signal line 940 on metal layer 4 and two portions 942 of another metal layer that are used to connect the horizontal signal line to a bit of the I/O circuitry 664*a*, a bit of the I/O circuitry 664*b*, and to form the I/O bit of input/output signal line. While the interconnect has been shown and described with reference to specific metal layers in FIG. 9B, those skilled in the art will realize that any other combinations of metal layers may be used. The use of such tiles 930, 932, 934, 936 is particularly advantageous since the tiles 930, 932, 934, 936 can be create and then simply selected based on the number of I/O bits in the I/O path. Furthermore, as can be seen each of the horizontal signal line 940 is virtually identical and differs only in position. Only one tilable cell needs to be designed and that tilable cell can be used for all I/O bits in the input/output path. Such a design ensures that the capacitive loading on each of the signal lines in the tilable interconnect 810 will be the same.

Figure 9C:
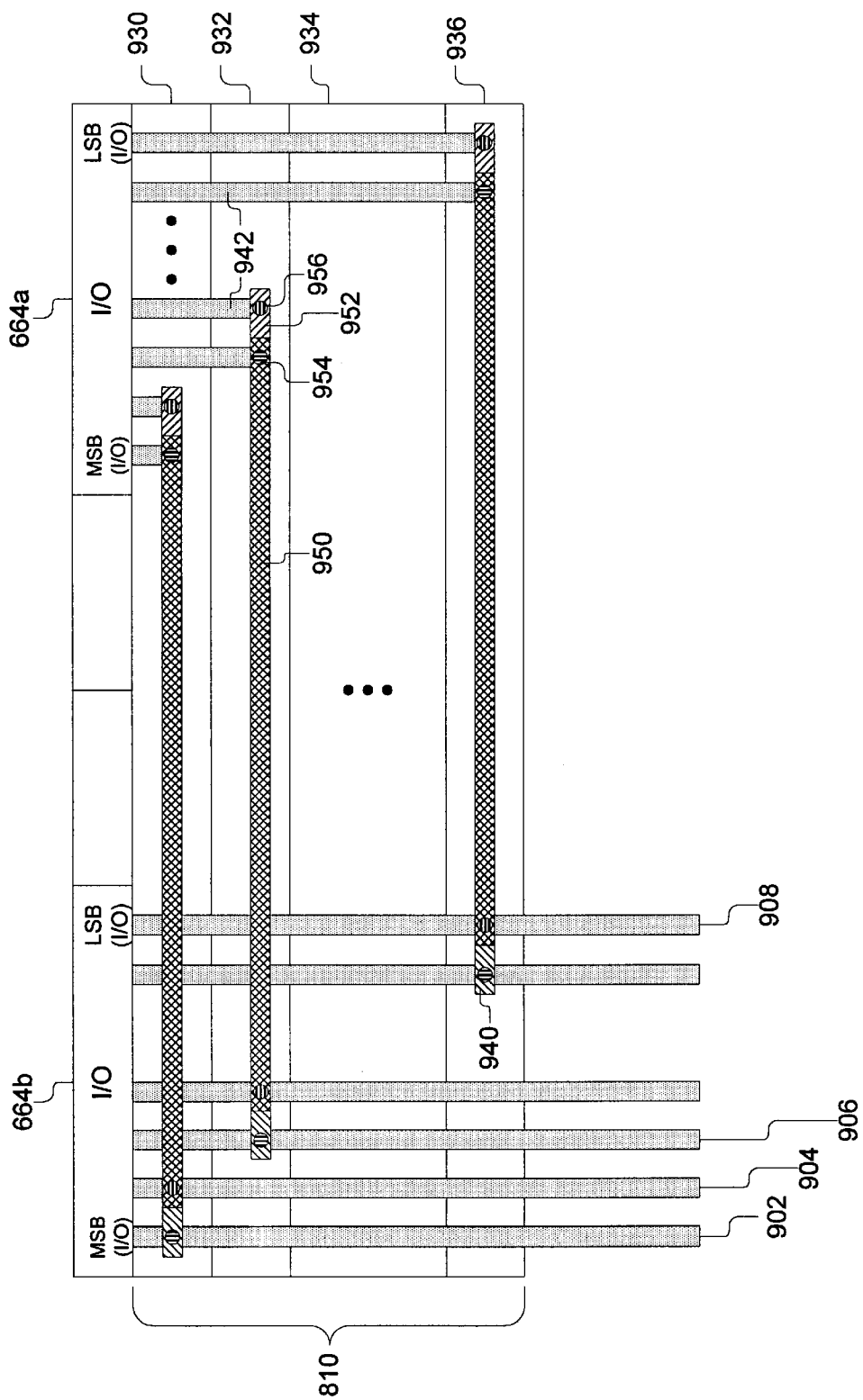
FIG. 9C is a top view block diagram of a second embodiment for the tilable interconnect using multiple metal layers.
Figure 9D:
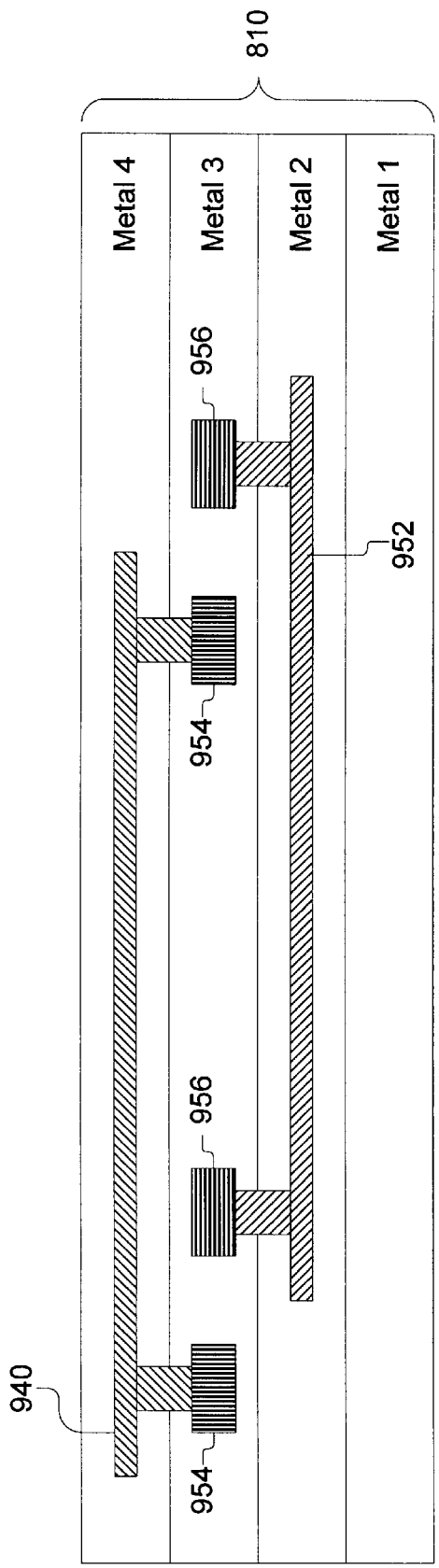
FIG. 9D is a cross-sectional view of the block diagram of the tilable interconnect of FIG. 9C that uses multiple metal layers.

Referring now to FIGS. 9C and 9D, a block diagram of a second embodiment for the tiles 930–936 forming the tilable interconnect structure 810 is shown. FIG. 9C shows a top view of the tilable interconnect structure 810 where each tile 930–936 uses a plurality of metal layers to provide multiple horizontal signal lines. As shown in FIG. 9C, each tile 930–936 couples a bit of the first I/O circuit 664*b* with a bit of the second I/O circuit 664*a*. By using additional metal layers in each tile 930–936, two such bit lines can be connected to two respective outputs in a single tile 930–936. Again, all of the horizontal signal lines in this embodiment also have the same dimensions, thereby ensuring the same capacitive loading for all signal lines. Each horizontal line on the tiles 930, 932, 934, 936 in FIG. 9C represents a pair of partially overlapping signal lines 940, 952 and the dots 954, 956 represent connections from different metal layers to other metal layers. For the embodiment shown in FIG. 9C, the vertical portions are preferably in metal layer 3, and each tile 930–936 includes a horizontal line 940 on metal layer 4 and a horizontal line 952 on metal layer 2. The portion of the horizontal lines where there is overlap between metal layer 2 and 4 are shown with cross-hatching and delineated by numeral 950. The shaded dots 954, 956 each represent a connection from a respective metal layer to another metal layer. For example, dot 954 represents a connection between metal layer 4 and metal layer 3, and dot 956 represents a connection between metal layer 2 and metal layer 3. The horizontal connecting lines 940, 952 and their relationship to other metal layers is best shown by FIG. 9D which is a cross-sectional view of the tilable interconnect 810 using multiple metal layers of FIG. 9C. Those skilled in the art will recognize the metal layers used in FIGS. 9A–9D are provided only by way of example, and that a variety of other combinations of metal layers in keeping the general principles of the present invention may also be used.

It is to be understood that the specific mechanisms and techniques that have been described are merely illustrative of one application of the principles of the invention. Numerous additional modifications may be made to the apparatus described above without departing from the true spirit of the invention.

What is claimed is:

1. A multiple bank memory device, the device comprising:
    a first tile having a combined array for storing and providing data, the first tile having a plurality of data lines and a plurality of control inputs;
    a second tile having a combined array for storing and providing data; the second tile having a plurality of data lines and a plurality of control inputs;
    a plurality of sense amplifiers each having an input and an output, the inputs of the plurality of sense amplifiers coupled to the data lines of the first tile and the data lines of the second tile;
    input/output circuitry for transmitting and receiving data; and
    a plurality of tilable signal lines coupling the outputs of the plurality of sense amplifiers to the input/output circuitry, the plurality of tilable signal lines extending over the second tile.

2. The multiple bank memory device of claim 1, wherein the combined array of the, first tile and the second tile further comprise a plurality of cells, each of the cells including tilable element for forming a word signal line.

3. The multiple bank memory device of claim 2, wherein the combined array of the, first tile and the second tile further comprise at least one strap cell, the strap cell including tilable element for forming the word signal line and for connecting the word signal line to other cells of the combined array.

4. The multiple bank memory device of claim 1, wherein the plurality of sense amplifiers are positioned between the first tile and the second tile, and the input/output circuitry is positioned on a side of the second tile opposite the plurality of sense amplifiers.

5. The multiple bank memory device of claim 1, wherein the combined array of the second tile includes a plurality of cells, and the signal lines are positioned and constructed over a plurality of tilable cells using a metal layer higher than a metal layer 3.

6. The multiple bank memory device of claim 1, wherein the combined array of the second tile includes a plurality of data cells and a plurality of strap cells, and the signal lines are positioned and constructed over the plurality of strap cells.

7. The multiple bank memory device of claim 1, further comprising an X pre-decoder having inputs and outputs for receiving control signals and outputting a signal indicating the row of each combined array to be addressed, the input of the x-predecoder coupled to receive the control signals.

8. The multiple bank memory device of claim 1, further comprising a control and Y pre-decoder logic for receiving control signals, the control and Y pre-decoder logic having inputs and outputs, the inputs of the control and Y pre-decoder logic coupled to receive address, read and write control signals, and the outputs of the control and Y pre-decoder logic coupled to the control inputs of each combined array, the control and Y pre-decoder logic using at least one bit of the control inputs to perform decoding in two dimensions.

9. The multiple bank memory device of claim 8, further comprising:
    a first reference column for providing a self-timed reset signal to the combined array of the first tile; and
    a second reference column for providing a self-timed reset signal to the combined array of the second tile.

10. The multiple bank memory device of claim 8, wherein only a single bit of the control inputs is used to determine if the first tile or the second tile is active.

11. The multiple bank memory device of claim 8, wherein the combined array of the first tile includes a first array and a second array, and the first tile further comprises:
    a reference column providing a self-timed reset signal to both the first array and the second array;
    an x-decoder having inputs and outputs for receiving control signals and outputting a signal indicating a row of the combined array to be addressed, the input of the x-decoder coupled to the control and Y pre-decoder logic;
    a first line driver for asserting, amplifying and sending control signals to the first array, the first line driver having a first input, a second input and an output, the first input of the first line driver coupled to the output of the x-decoder, and the output of the first line driver coupled to control inputs of the first array;
    a second line driver for asserting, amplifying and sending control signals to the second array, the second line driver having a first input, a second input and an output, the first input of the second line driver coupled to the output of the x-decoder, and the output of the second line driver coupled to control inputs of the second array; and
    wherein the control and Y pre-decoder logic includes pre-decode logic coupled to receive control signals, the pre-decode logic generating a first signal and a second signal based on the bit of the control inputs to alternatively activate the first line driver and the second line driver, the control and Y pre-decoder logic coupled to the second input of the first line driver to provide the first signal, and coupled to the second input of the second line driver to provide the second signal.

12. The multiple bank memory device of claim 11, wherein the first and second word line drivers are positioned on the side of the combined array between the x-decoder and the combined array.

13. The multiple bank memory device of claim 11, further comprising the plurality of sense amplifiers, and wherein each sense amplifier is coupled to a bit line of the first array and a corresponding bit line of the second array.

14. The multiple bank memory device of claim 11, further comprising:
    an second x-decoder having inputs and outputs for receiving control signals and outputting a signal indicating a row of the combined array to be addressed, the input of the second x-decoder coupled to the control and Y pre-decoder logic;
    a third line driver for asserting, amplifying and sending control signals to the first array, the third line driver having a first input, a second input and an output, the first input of the third line driver coupled to the output of the second x-decoder, and the output of the third line driver coupled to control inputs of the first array;
    a fourth line driver for asserting, amplifying and sending control signals to the second array, the fourth line driver having a first input, a second input and an output, the first input of the fourth line driver coupled to the output of the second x-decoder, and the output of the fourth line driver coupled to control inputs of the second array.

15. The multiple bank memory device of claim 8, wherein the combined array of the first tile includes a first array and a second array, and the first tile further comprises:

a first pre-charge circuit having a control input, the first pre-charge circuit activated in response to a signal on the control input, the first pre-charge circuit coupled to a first bit line, the first pre-charge circuit charging the first bit line;

a second pre-charge circuit having a control input, the second pre-charge circuit activated in response to a signal on the control input, the second pre-charge circuit coupled to a second bit line, the second pre-charge circuit charging the second bit line;

a y-multiplexer having a first input coupled to the first bit line, a second input coupled to the second bit line, and control input and output, the y-multiplexer providing one signal from the first and second input of the y-multiplexer at the output of the y-multiplexer in response to a control signal on the control input of the y-multiplexer; and wherein the control and Y pre-decoder logic includes pre-decode logic coupled to receive control signals, the pre-decode logic generating a first signal and a second signal based on the bit of the control inputs to alternatively activate the first pre-charge circuit and the second pre-charge circuit, the pre-decode logic coupled to the control input of the first pre-charge circuit and the control input of the y-multiplexer to provide the first signal, and coupled to the control input of the second pre-charge circuit to provide the second signal.

16. The multiple bank memory device of claim 1, wherein the combined array of the first and second tiles include a plurality of memory cells and wherein at least one of the memory cells is a single port RAM cell formed from a plurality of transistors.

17. The multiple bank memory device of claim 1, wherein the combined array of the first and second tiles includes a plurality of memory cells and wherein at least one the memory cells is a dual port RAM cell formed from a plurality of transistors.

18. The multiple bank memory device of claim 1, wherein the combined array of the first and second tiles includes a plurality of memory cells and wherein at least one of the memory cell is a read only memory cell formed from a plurality of transistors.

19. The multiple bank memory device of claim 1, wherein the combined array includes a plurality of memory cells and wherein each of the memory cell is a $E^2$PROM cell formed from a plurality of transistors.

20. The multiple bank memory device of claim 1, wherein the combined array includes a plurality of memory cells and wherein each of the memory cell is a EPROM cell formed from a plurality of transistors.

21. The multiple bank memory device of claim 1, wherein the combined array includes a plurality of memory cells and wherein each of the memory cell is a DRAM cell formed from a plurality of transistors.

22. The multiple bank memory device of claim 1, wherein the combined array includes a plurality of memory cells and wherein each of the memory cell is a flash memory cell formed from a plurality of transistors.

23. A multiple bank memory device, the device comprising:

a first tile having a combined array for storing and providing data, the first tile having a plurality of data lines and a plurality of control inputs;

a second tile having a combined array for storing and providing data; the second tile having a plurality of data lines and a plurality of control inputs;

a first input/output circuit for providing data and control signals to the first tile, the first input/output circuit coupled to the first tile;

a second input/output circuit for providing data and control signals to the second tile, the second input/output circuit coupled to the second tile; and a tilable integrated circuit area portion for coupling the first input/output circuit and the second input/output circuit, the tilable integrated circuit area positioned adjacent to both the first input/output circuit and the second input/output circuit, the tilable integrated circuit area providing a single interface coupling with both the first and second tiles.

24. The multiple bank memory device of claim 23, wherein the tilable integrated circuit area portion is formed from a plurality of tilable areas that extend horizontally over most of the length of the first input/output circuit and the second input/output circuit.

25. The multiple bank memory device of claim 23, wherein the tilable integrated circuit area portion is formed from a plurality of tilable areas that extend vertically away from the first input/output circuit and the second input/output circuit, with the combined lengths of the plurality of tilable areas about the same as the horizontal length of the first input/output circuit and the second input/output circuit.

26. The multiple bank memory device of claim 23, wherein the tilable integrated circuit area portion uses a plurality of metal layers to interconnect the first input/output circuit and the second input/output circuit.

27. The multiple bank memory device of claim 23, wherein at least one or the plurality of tilable areas uses two metal layers, each metal layer being used to couple a respective bit to the output of the multiple bank memory device.

* * * * *